(12) United States Patent
Rhoades et al.

(10) Patent No.: US 11,984,447 B2
(45) Date of Patent: May 14, 2024

(54) SEMICONDUCTOR WORK FUNCTION REFERENCE CIRCUIT FOR RADIATION DETECTION

(71) Applicant: Georgia Tech Research Corporation, Atlanta, GA (US)

(72) Inventors: Elaine Rhoades, Albuquerque, NM (US); Aaron S. Green, Atlanta, GA (US); William Daniel Hunt, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 101 days.

(21) Appl. No.: 17/653,020

(22) Filed: Mar. 1, 2022

(65) Prior Publication Data
US 2022/0392895 A1 Dec. 8, 2022

Related U.S. Application Data

(60) Provisional application No. 63/155,026, filed on Mar. 1, 2021.

(51) Int. Cl.
*H01L 27/08* (2006.01)
*G01T 1/24* (2006.01)
*G05F 1/565* (2006.01)
*H01L 27/095* (2006.01)

(52) U.S. Cl.
CPC ............ *H01L 27/0814* (2013.01); *G01T 1/24* (2013.01); *G05F 1/565* (2013.01); *H01L 27/095* (2013.01)

(58) Field of Classification Search
CPC ..... H01L 27/0814; H01L 27/095; G01T 1/24; G05F 1/565
See application file for complete search history.

(56) References Cited

U.S. PATENT DOCUMENTS 3,675,140 A * 7/1972 Fang ....................... H03F 13/00
330/250
4,749,849 A * 6/1988 Hoeberechts ........ G11B 7/1381
257/E31.115

(Continued)

*Primary Examiner* — Hugh Maupin
(74) *Attorney, Agent, or Firm* — Troutman Pepper Hamilton Sanders LLP; Ryan A. Schneider; Stephanie J. Remy

(57) ABSTRACT

An exemplary embodiment of the present disclosure provides a detector configured to output a signal associated with one or more interactions with subatomic particles. The detector comprises a sensor comprising a first diode comprising first semiconductor material abutting a first metal and forming a first junction, wherein the sensor is configured to be exposed to subatomic particles and a voltage reference member configured to generate a reference measurement. The sensor and the voltage reference member form a bandgap reference circuit. The present disclosure also provides methods for detecting subatomic particles from a solid-state detector comprising a first Schottky diode in electrical communication with a reference voltage member comprising a parallel circuit of two or more second Schottky diodes, wherein the first Schottky diode is configured to be exposed to subatomic particles and the second Schottky diodes of the reference voltage member are configured to generate a reference measurement.

20 Claims, 25 Drawing Sheets

(56) References Cited

U.S. PATENT DOCUMENTS

| | | | | |
|---|---|---|---|---|
| 4,948,989 | A * | 8/1990 | Spratt | G05F 3/18 |
| | | | | 327/540 |
| 5,164,615 | A * | 11/1992 | Walters | G05F 3/16 |
| | | | | 257/469 |
| 5,619,057 | A * | 4/1997 | Komatsu | H01L 21/76855 |
| | | | | 257/E29.152 |
| 5,811,809 | A * | 9/1998 | Smith | G01R 19/16523 |
| | | | | 250/370.15 |
| 10,422,896 | B1 * | 9/2019 | Ianakiev | G01T 3/008 |
| 2003/0020133 | A1 * | 1/2003 | Dahlqvist | H01L 29/872 |
| | | | | 257/E29.104 |
| 2010/0213380 | A1 * | 8/2010 | Kub | G01T 3/08 |
| | | | | 257/E31.086 |
| 2011/0163242 | A1 * | 7/2011 | Mao | G01T 3/08 |
| | | | | 257/E31.086 |
| 2012/0148004 | A1 * | 6/2012 | Caruso | G01T 3/08 |
| | | | | 250/391 |
| 2014/0138555 | A1 * | 5/2014 | Hannah | G01R 31/31816 |
| | | | | 250/336.1 |

* cited by examiner

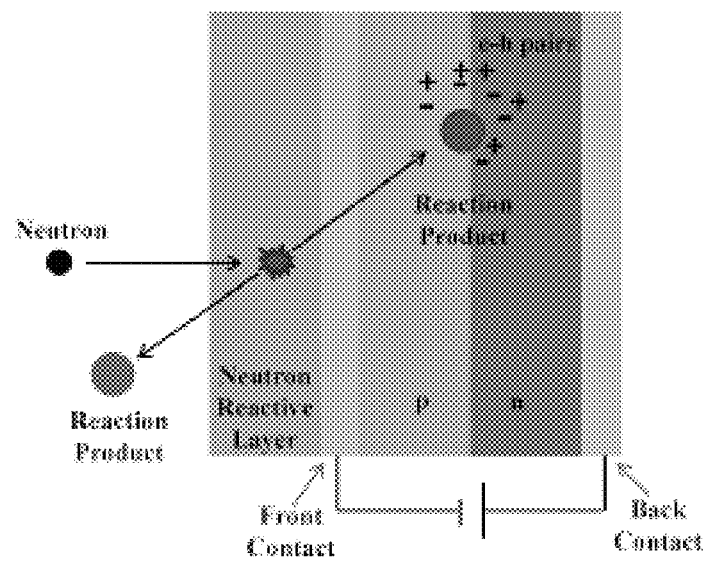
FIG. 1A (*Prior Art*)
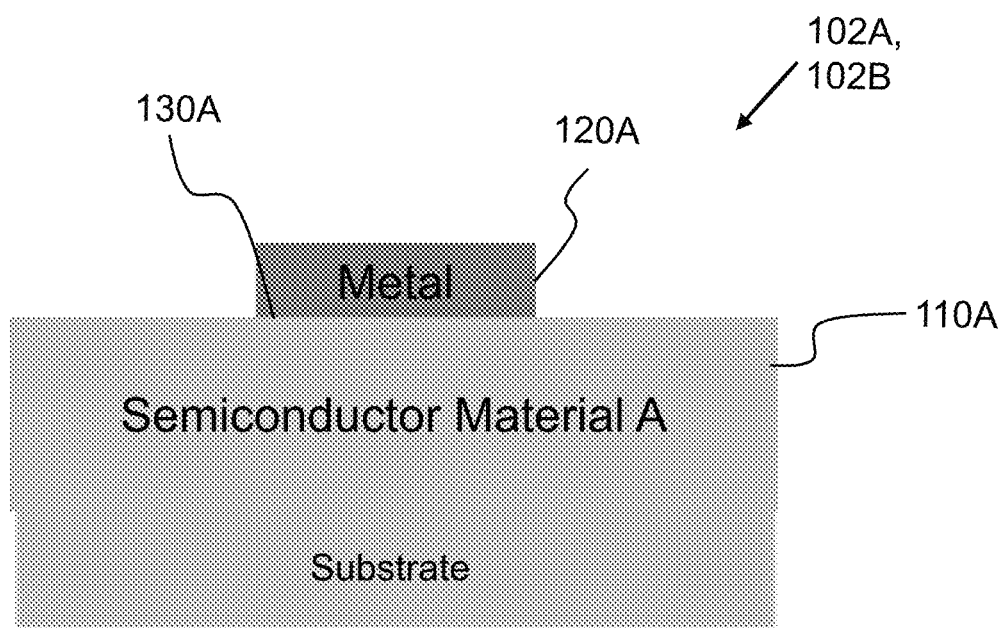
FIG. 1B

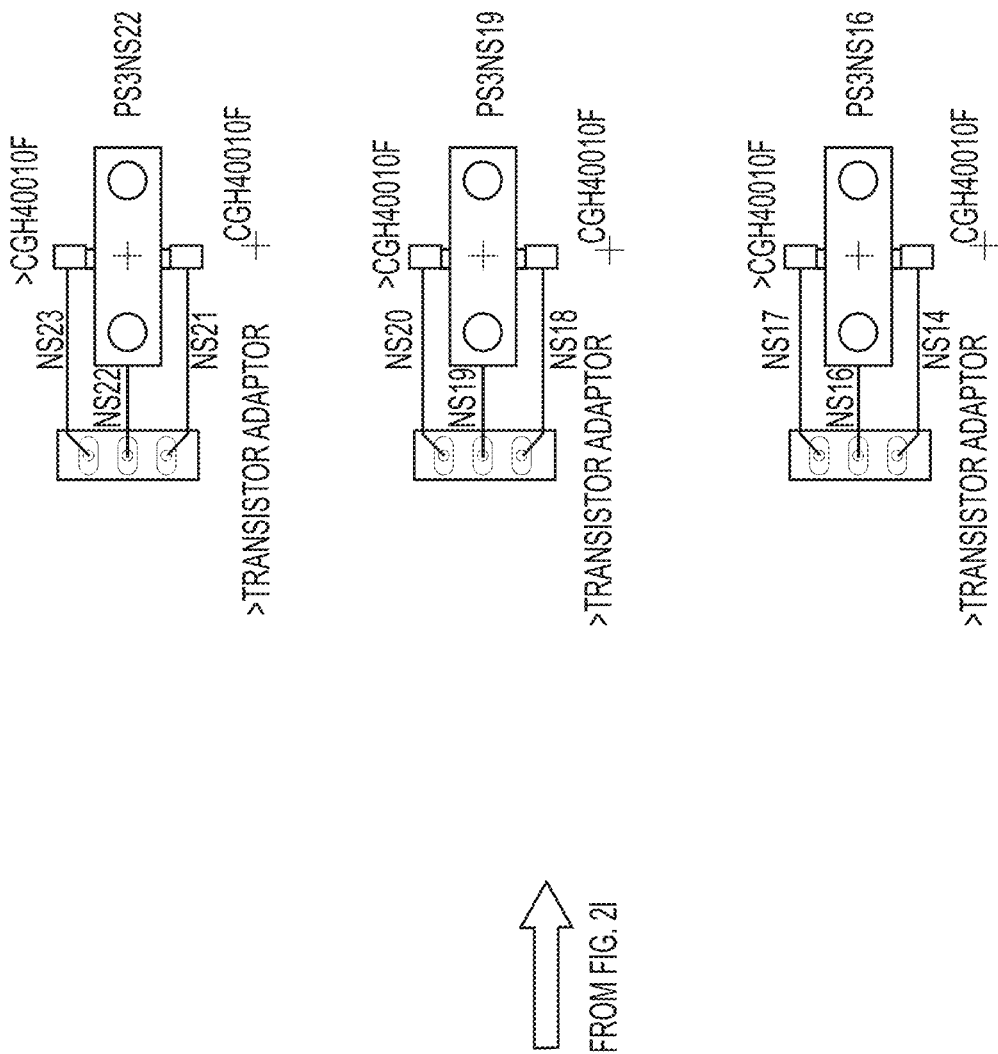

1200

```
┌─────────────────────────────────────────┐
│ Provide a detector comprising a first   │
│ diode and a second diode in electrical  │
│ communication, wherein the first diode  │
│ comprises a first semiconducting        │──1202
│ material abutting a first metal and     │
│ forming a first junction, Wherein the   │
│ second diode comprises a second         │
│ semiconducting material abutting a      │
│ second metal and forming a second       │
│ junction, wherein the second diode is   │
│ configured to generate a reference      │
│ measurement                             │
└─────────────────────────────────────────┘
                    │
                    ▼
┌─────────────────────────────────────────┐
│ Expose the first diode of the detector  │──1204
│ with one or more subatomic particles    │
└─────────────────────────────────────────┘
                    │
                    ▼
┌─────────────────────────────────────────┐
│ Measure a change in work function in    │
│ the first diode with respect to the     │──1206
│ reference measurement of the second     │
│ diode                                   │
└─────────────────────────────────────────┘
                    │
                    ▼
┌─────────────────────────────────────────┐
│ Output the change work function as a    │
│ signal associated with interactions     │──1208
│ with the one or more subatomic          │
│ particles                               │
└─────────────────────────────────────────┘
```

FIG. 12

SEMICONDUCTOR WORK FUNCTION REFERENCE CIRCUIT FOR RADIATION DETECTION

CROSS-REFERENCE TO RELATED APPLICATIONS

This application claims the benefit of U.S. Provisional Application Ser. No. 63/155,026, filed on 1 Mar. 2021, which is incorporated herein by reference in its entirety as if fully set forth below.

FIELD OF THE DISCLOSURE

The various embodiments of the present disclosure relate generally to systems and methods to detect subatomic particles, and more particularly to systems and methods for detection of subatomic particles using a modified bandgap reference circuit.

BACKGROUND

Within the field of particle detection, there are two general categories of particle detector designs. The first are massive systems like the detector A Torodial LHC Apparatus (AT-LAS) and other systems implemented at the Large Hadron Collider (LHC) at the European Organization for Nuclear Research (CERN) that are physically large, involve several stages, and are expensive to build and maintain, and as such, is limited to only a few realized experiments that are fixed geographically after construction. There are some limitations to using detector systems like ATLAS such as storing, managing, and analyzing the amount of data, luminosity (a property that indicates the likelihood of a particle collision) and synchrotron radiation (when particles that are deflected in a magnetic field may lose energy as they spontaneously emit light). In particular, synchrotron radiation is a problem that increases as energy within the LHC increases. As a result, there are limitations on the strength of magnets that can be used for both the central solenoid and the toroidal magnet system.

The second category of particle detectors is solid state particle detector systems that can be portable but may be limited in what they can determine about a particle that interacts with the detector. Well-known designs for particle detection utilize a semiconductor (typically silicon) to measure the presence of charged particles or photons by generating free electron-hole pairs when an incident particle interacts with the detector under an applied bias. The measured current produced by the movement of electron-hole pairs can relate to the intensity of the incident particles. While these prior detectors can indicate when a charged particle interacts with the detector, there is insufficient information to analyze the tracks produced in the detector.

A solid state nuclear track detector (SSNTDs) can address this limitation by analyzing the creation of tracks produced in the detector under particle impingement but have severe limitations with recording data (cloud chambers) or information loss when exposed to light (nuclear emulsion detectors), among other issues. In addition, when energetic particles interact with SSNTDs, they can sub-microscopically damage the material structure along their path. SSNTDs utilize this effect and enlarge the tracks with chemical etching techniques, however, this process takes time and may not be ideal for measuring transient subatomic particles. In addition, this method of detection is extremely sensitive to variations in solids, so much so that even the same material exposed to the same incident radiation can have different results when manufactured by different companies. Another limitation of SSNTDs is that tracks that intersect with a surface can be etched. Furthermore, for tracks that are at a shallower angle than a material-dependent critical angle, the surface of the detector can etch away faster than the track can be developed. Both of these concerns reduce the amount of usable detection data and can thereby lower the detection efficiency of these detectors in some conditions.

Accordingly, a need exists for systems and methods for increasing sensitivity and real-time in situ measurements to particle detection using transient signatures in the output of a detector. Such a system and method may expand the capabilities of smaller-scale semiconductor particle detectors for particle-detector interactions that may be incorporated into a personal dosimeter design or other detector for personal radiation measurement.

BRIEF SUMMARY

The present disclosure relates to a detector and methods of detecting subatomic particles. An exemplary embodiment of the present disclosure provides a detector that can be configured to output a signal associated with one or more interactions with subatomic particles. In some embodiments, the detector can comprise a sensor and a voltage reference member. In some embodiments, the sensor can comprise a first diode. The first diode can comprise a first semiconductor material abutting a first metal, which can form a first junction. The sensor can be configured to be exposed to subatomic particles. In some embodiments, the voltage reference member can be configured to generate a reference measurement. In some non-limiting embodiments, the sensor and the voltage reference member can be in electrical communication.

In some embodiments, the voltage reference member can comprise two or more second diodes. Each second diode can independently comprise a second semiconducting material. The second semiconducting material can abut a second metal and can form a second junction. In some embodiments, the two or more diodes can be connected in a parallel circuit.

In some embodiments, the first semiconductor can comprise a first piezoelectric lattice and the second semiconductor materials can comprise a second piezoelectric lattice.

In any of the embodiments disclosed herein the first and second semiconductor materials can independently comprise GaN, GaAs, SiC, AlGaN, AlGaAs, AlInAs, GaInAs, InGaN, ScAlN, CuInP$_2$S$_6$, Pb(Zr$_{0.4}$Ti$_{0.6}$)O$_3$, each individually or combinations thereof.

In some embodiments, the sensor and voltage reference member can be in electrical communication and can form a bandgap reference circuit having an energy output that can be substantially proportional to an energy level barrier height of the first junction of the sensor. The barrier height of the first junction can satisfy the following equation, $$\Phi_B(t)=\phi_m(t)-X_e(t),$$

wherein $\Phi_B$ can be the barrier height of the first junction, $\phi_m$ can be a metal work function of the first metal, $X_e$ can be an electron affinity of the first semiconducting material, and t can be a time of a subatomic particle passing through the detector.

In some embodiments, a change in the barrier height of the first junction can correspond to a voltage output of the detector. The voltage output of the detector can be substantially proportional to the work function of the detector. A change in the voltage output of the detector can be associated with a signal signature for the subatomic particles.

In some embodiments, the detector can be configured to output a first signal associated with a first subatomic particle and a second signal associated with a second subatomic particle. The first subatomic particle can be different than the second subatomic particle.

In some embodiments, the detector can further comprise one or more transistors in electrical communication with the sensor and the voltage reference member. The one or more transistors can include one or more of a junction-gate field-effect transistor (JFET), a heterojunction bipolar transistor (HBT), a high electron mobility transistor (HEMT), a metal-semiconductor field-effect transistor (MESFET), a metal-oxide-semiconductor field-effect transistor (MOSFET), and a complementary metal-oxide-semiconductor (CMOS).

Another non-limiting exemplary embodiment of the present disclosure provides a method of detecting subatomic particles. The method can comprise providing a detector. In some embodiments, the detector can comprise a sensor and a voltage reference member that can be in electrical communication. The sensor can comprise a first diode. The first diode can comprise a first semiconducting material which can abut a first metal and can form a first junction. The voltage reference member can comprise two or more second diodes. Each second diode can comprise a second semiconducting material. In some embodiments, the second semiconducting material can abut a second metal and can form a second junction. In some non-limiting embodiments, the voltage reference member can be configured to generate a reference measurement.

In some embodiments, the method of detecting subatomic particles can further comprise exposing the sensor of the detector with one or more subatomic particles. The method can further comprise measuring a change in work function in the sensor with respect to the voltage reference member. In some embodiments, the method can further comprise outputting the change in work function as a signal associated with interactions with the one or more subatomic particles.

In some embodiments, the first semiconductor can comprise a first piezoelectric lattice and the second semiconductor materials can comprises a second piezoelectric lattice. In some embodiments, exposing the sensor of the detector with one or more subatomic particles can comprise generating one or more of an acoustic wave throughout the sensor such that an electric field is propagated within the piezoelectric lattice.

In some embodiments, the method can further comprise forming a bandgap reference circuit between the sensor and the voltage reference member.

In some embodiments, measuring the change in work function in the sensor with respect to the reference measurement of the voltage reference member can comprise determining a barrier height of the first junction of the sensor from the bandgap reference circuit. In some embodiments, the barrier height of the first junction can satisfy the following equation, $$\Phi_B(t) = \phi_m(t) - X_e(t),$$

wherein $\Phi_B$ can be the barrier height of the first junction, $\phi_m$ can be a metal work function of the first metal, $X_e$ can be an electron affinity of the first semiconducting material, and t can be a time of a subatomic particle passing through the detector.

In some embodiments, outputting the change in work function as a signal associated with interactions with the one or more subatomic particles can further comprise correlating the signal to a reference library. The reference library can comprise signals of one or more properties of subatomic particles. Properties of subatomic particles can comprise of, including but not limited to, particle type, particle energy, particle direction, and particle location relative to the detector, and other particle properties known in the art.

In some embodiments, the signal associated with interactions with the one or more subatomic particles can comprise a feature of one or more of signal shape, decay time, and frequency spectra.

Another non-limiting exemplary embodiment of the present disclosure provides a method of detecting subatomic particles from a solid-state detector. The method can comprise providing a detector. The detector can comprise a first Schottky diode in electrical communication with a reference voltage member. The reference voltage member can comprise a parallel circuit of two or more second Schottky diodes.

In some embodiments, the first Schottky diode can be configured to be exposed to subatomic particles and the reference voltage member can be configured to generate a reference measurement. The method can comprise of detecting a change in voltage of the first Schottky diode. The method can further comprise generating an output based on a difference in voltage of the first Schottky diode with the reference measurement of the reference voltage member. The output can be indicative of one or more interactions with subatomic particles.

In some embodiments, the method can further include monitoring transient differences in voltage, which can be associated with one or more interactions with subatomic particles. In some examples, monitoring transient differences in voltage can further comprise detecting radiation. In some embodiments, the output from the detector can be approximately proportional to an energy level barrier height of the first Schottky diode.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIG. 1A illustrates a schematic of a traditional solid state detector in the prior art with a neutron absorption layer with an applied bias and charge amplifier with capacitor and resistor for feedback control, for comparison with the present disclosure.

FIGS. 1B and 1C provide schematics of cross-sections of example diodes, in accordance with an exemplary embodiment of the present disclosure.

FIG. 12 is a flowchart illustrating a method of detecting one or more subatomic particles, in accordance with an exemplary embodiment of the present disclosure.

DETAILED DESCRIPTION

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

As shown in FIG. 1A, prior detection techniques for neutrons require the use of a large layer of boron-10 ($^{10}$B) or lithium fluoride (LiF) materials to function as a neutron absorption or neutron reactive layer. This neutron absorption layer captures a neutron and create secondary reaction products such as an alpha particle and a lithium-7 ion (when using $^{10}$B), or an alpha particle and a tritium ion (when using LiF). When a neutron or other subatomic particle interacts with this neutron absorption layer, charged products are generated that move in opposite directions to generate a charge in the detector. As shown in FIG. 1A, the prior art solid state detector has a neutron reactive layer that the neutron interacts with, causing a first reaction product to travel outside of the detector and a second reaction product to enter into the p-n junction of the detector to cause a charge. Without layers of either $^{10}$B or LiF, prior solid state detectors could not detect interactions with neutrons due to the inability of the neutron to react and form charged particles. In addition, these prior neutron detectors can only detect such a subatomic particle that properly interacts with this layer, including incident angle of contact, momentum, and the like. There is a low probability that a neutron will properly interacting with the layer, so these prior art detectors actually miss a majority of the neutrons.

Figure 1C:
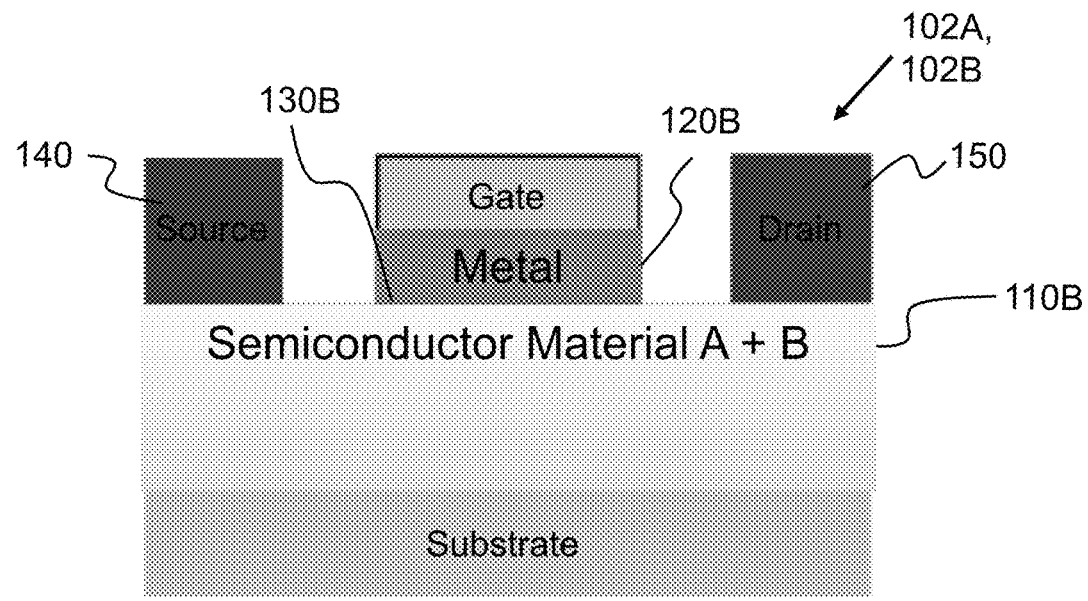
Figure 2A:
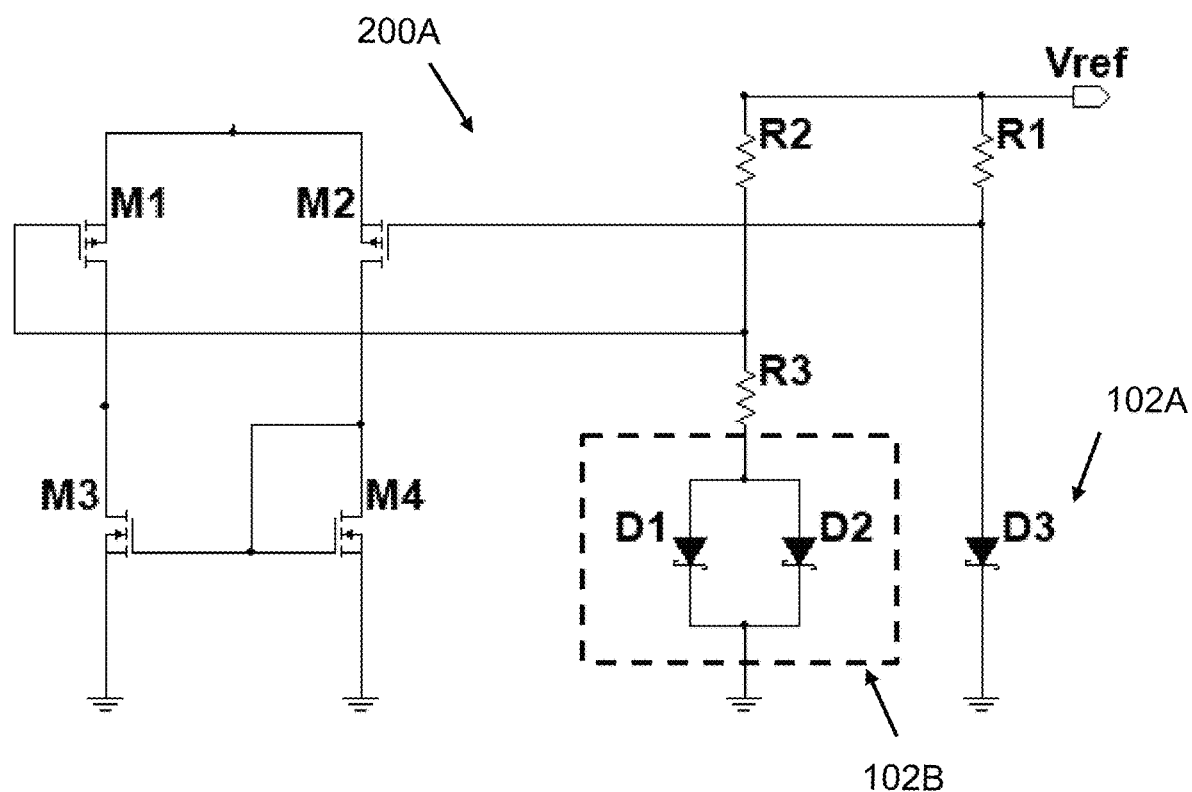
FIGS. 2A through 2J provide circuit design schematics and board layouts for example work function reference circuits; in accordance with an exemplary embodiment of the present disclosure.

As shown in FIGS. 1B and 1C, exemplary embodiments of the present invention provide schematics of cross-sections of example diodes. In one example, a detector 200 can include a sensor 102A and a voltage reference member 102B in electrical communication, as shown in FIG. 2A and described in more detail below. The sensor 102A can have a first diode including a first semiconductor material 110A abutting a first metal 120A, as shown in FIG. 1B. Where the first semiconductor material 110A and first metal 120A contact, a first junction 130A can form. Alternatively, or in addition thereto, the sensor can also have a source 140 and a drain 150. In certain examples, the sensor 102A and/or the voltage reference member 102B can each independently be a heterostructure field-effect transistor (HFET) or a high electron mobility transistor (HEMT) with the source 140 and drain 150 shorted together to function as a Schottky diode, as illustrated in FIG. 1C. As would be understood by one of skill in the art, any suitable diode having a metal-semiconductor junction forming a Schottky diode can function for either or both of the sensor 102A and/or the voltage reference member 102B.

In some embodiments, voltage reference member 102B can be an electronic device that can produce a fixed or constant voltage, irrespective of the loading on the device, power supply variations, temperature changes, and the passage of time. The voltage reference member 102B may include one or more diodes, each independently having a second semiconductor material 110B abutting a second metal 120B and forming a second junction 130B. As shown in FIG. 2A, reference diode 102B may be two or more second diodes connected in either a parallel circuit or a series circuit. The second junction 130B of the two or more diodes (collectively, the "second diode") making up the voltage reference member 102B may be substantially similar to the first junction 130A of the sensor 102A. Alternatively, the second junction 130B of the voltage reference member 102B may be substantially distinct from the first junction 130 of the sensor 102A. In yet another example, the one or more diodes making up the voltage reference member 102B may be identical while sensor 102A is substantially distinct from the second diode. As would be appreciated by one of skill in the art, keeping the electrical properties of the diodes in parallel as substantially similar while adjusting the electrical properties of the diode interacting with the particles to be detected may be adjusted to create different detectors for various applications ranging from detection of radioactivity levels within a core of a reactor to detection of transient signals within an atmosphere during administration of nuclear medicine.

In certain embodiments, the semiconductor material of any of the sensor 102A or voltage reference member 102B can include one or more piezoelectric materials, which generate an electric charge within the material in response to an applied energy propagation. The piezoelectric materials can include an ordered arrangement of atoms in a crystalline materials, forming a crystal lattice. The applied energy propagation can include mechanical stress, acoustic waves, electromagnetic waves, pressure waves, shear waves generated from an interaction with one or more subatomic particles. In addition, the piezoelectric effect between the electrical and mechanical states of the material may be a reversible process, such that the material is unchanged after formation of the applied electrical field. Any suitable crystalline material demonstrating a piezoelectric effect can include, but are not limited to, $GaPO_4$, $LiNbO_3$, $LiTaO_3$, $AlPO_4$, $PbTiO_3$, $ZnO$, $NaNbO_3$, $BiFeO_3$, $BaTiO_3$, $Bi_4Ti_3O_{12}$, GaN, GaAs, SiC, ScAlN, InN, AlN, ZnO, AlGaN, InGaAs, $CuInP_2S_6$, $Pb(Zr_{0.4}Ti_{0.6})O_3$ and the like.

In some examples, the semiconductor material of any of the sensor 102A or voltage reference member 102B can be a group IV or group VI elemental semiconductor (e.g., C, Si, Ge, Sn, S, Se, Te), or a compound semiconductor formed from the combination of one or more group III or IV elements (e.g., B, Al, Ga, In, C, Si, Ge, Sn, Pb) with group V elements (e.g., N, P, As, Sb, Bi) to form binary, ternary, and/or quaternary alloys. Although not wishing to be bound by theory, the first semiconductor 110A can be, for instance, GaN, GaAs, SiC, InGaAs, AlGaN, AlGaAs, AlInGaP, InAsSbP, and combinations thereof.

In some embodiments, the metal of the sensor 102A or voltage reference member 102B can be any suitable metal used for forming a Schottky diode, such as, without limitation, gold, silver, molybdenum, tungsten, platinum, nickel, copper, and the like.

In some examples, the junction formed between the semiconductor material and metal of either one or both of the sensor 102A or voltage reference member 102B can form a metal-semiconductor junction that can either be rectifying or non-rectifying. The rectifying metal-semiconductor junction can form a Schottky barrier, or a Schottky diode. The non-rectifying metal-semiconductor junction can form an ohmic contact. With an ohmic contact, the metal-semiconductor junction can easily conduct an electrical charge between an active region of a transistor and an external circuit. With a Schottky diode, the semiconductor material is depleted near the metal when the Schottky barrier height is significantly higher than the thermal energy.

Using the Schottky barrier height at the first junction 130A of the sensor 102A in combination with the Schottky barrier height of the second junction 130B of the voltage reference member 102B can form a modified bandgap reference circuit. A bandgap reference circuit is designed such that the output is the bandgap energy of the semiconductor material used in a circuit. In addition, bandgap reference circuits provide a temperature independent voltage reference member that produces a fixed voltage regardless of power supply variations, temperature changes, or circuit loading from a device.

When the sensor 102A and the voltage reference member 102B in electrical communication form a bandgap reference circuit having an energy output, such as a voltage. The output of the bandgap reference circuit can be substantially proportional to an energy level barrier height of the first junction 130A and of the sensor 102A. In general, the barrier height of the first junction 130A can satisfy the following equation:

$\Phi_B(t)=\phi_m(t)-X_e(t)$, wherein $\Phi_B$ is the barrier height of the first junction of the sensor, $\phi_m$ is a metal work function of the first metal, $X_e$ is an electron affinity of the first semiconducting material, and t is a time of a subatomic particle passing through the detector. The metal work function is dependent on the metal material forming the metal-semiconductor junction described supra. Similarly, the electron affinity is dependent on the material of the semiconductor in the metal-semiconductor junction. The barrier height is a function of time, t, where the relationship between Schottky barrier height of the first junction 130A, metal work function of the first metal 120A and electron affinity of the first semiconductor 110A evolves as a function of time based on the interaction generated by a subatomic particle passing through the detector 200, and more particularly, passing through the sensor 102A.

The voltage reference member 102B can be substantially similar to the sensor 102A by having a second semiconductor material 110B, a second metal 120B, and a second junction 130B. In some embodiments, the sensor 102A and the voltage reference member 102B have substantially the same electrical properties and the same layered materials. In certain embodiments, the sensor 102A and the voltage reference member 102B have different layered materials that general distinct electrical properties. Although not wanting to be bound by theory, sensor 102A may include a semiconductor material "A" as shown in FIG. 1B, where the semiconductor material "A" represents a uniform crystalline lattice, such as, for instance, GaN, whereas voltage reference member 102B may have a mixture of semiconductor materials "A+B" as demonstrated in FIG. 1C, where the semiconductor material "A+B" represents more than one crystalline lattice, such as, for instance, GaN and AlGaN. Alternatively, sensor 102A and voltage reference member 102B may independently be a uniform semiconductor material of FIG. 1B, or of a mixture of semiconductor materials of FIG. 1C.

The type of semiconductor for the semiconductor material of the sensor 102A or voltage reference member 102B can impact the first junction 130A by impacting the electron affinity and changing the Schottky barrier height. For instance, for an n-type semiconductor, the Schottky barrier height will be the difference between the interfacial conduction band edge and the Fermi level, whereas for a p-type semiconductor, the Schottky barrier height will be the difference between the Fermi level and the valence band edge.

As discussed supra in FIG. 1A, most detection techniques for neutrons require the use of boron-10 ($^{10}$B) or lithium fluoride (LiF) to capture a neutron and create secondary reaction products—an alpha particle and a lithium-7 ion in the case of boron-10, or an alpha particle and a tritium ion for lithium fluoride—that can then be detected. In contrast, the detector 200 can extract information from transient events that occur in the first semiconductor material 110A from momenta transfer due to the piezoelectric effect generated when the transient events form an energy propagation wave at the first junction 130A. Said another way, without the use of a neutron reactive layer, detector 200 can detect the type of particle interacting with the surface of the detector when an incident particle scatters off an atom contained within the semiconductor lattice of the sensor 102A, and more particularly with the first metal 120A and the crystalline lattice of the first semiconductor material 110A. An incident particle scattering and interacting with the first semiconductor material 110A and/or the first metal 120A can generate acoustic waves that induce a stress-strain field and an electric charge within the piezoelectric crystalline lattice as a result of the propagation of the acoustic waves. Such fluctuations at the first junction 130A can cause a change in the Schottky barrier height at the first junction 130A of the first diode 102A, which can be compared to the Schottky barrier height of the second diode 102B. The change in barrier height between the first diode 102A and the second diode 102B can be substantially equal to a voltage output of the detector.

The voltage output of the detector can be substantially proportional to a work function of the detector. In particular, the voltage output does not need to be equal to the work function, such that having a fixed voltage baseline provided by the voltage reference member 102B can suffice to see temporal or transient changes and fluctuations in the voltage output of the sensor 102A to indicate an interaction with a subatomic particle. Such changes in the voltage output and/or the work function of the detector are not necessarily permanent or long-term changes but are more preferably temporary and short-lived due to the transient nature of subatomic particle interactions.

A change in voltage output of the detector can be associated with a signal signature of a particular subatomic particle. For instance, a neutron interaction with the detector can have a distinct signature, whereas an alpha particle interaction with the detector can generate a distinct signature different from the neutron signature. In addition, the signal signature of a particular subatomic particle can be calibrated into a reference library. The reference library can include signals of properties of various subatomic particles. For instance, the reference library can include information of a particle type, particle energy, particle direction, and/or particle location relative to the detector.

The semiconductor materials can be fabricated by any suitable methods for growing or depositing such materials. Some suitable methods include metalorganic vapor-phase epitaxy (MOVPE), molecular-beam epitaxy (MBE), hydride vapor-phase epitaxy (HYPE), liquid phase epitaxy (LPE), Metal-organic molecular-beam epitaxy (MOMBE), atomic layer deposition (ALD).

Referring to FIGS. 2A through 2J, detector 200A-200E may have various circuit designs and respective board layouts for creating example work function reference circuits. Specifically referring to FIG. 2A, the circuit operation relies on a total area difference on the two legs of the circuit that start with resistor 1 ("R1") and resistor 2 ("R2"). Additional resistors may be added to the circuit design, as illustrated in FIGS. 2A through 2J. The difference results from an effective double area with the reference voltage 102B, the diodes "D1" and "D2" compared to the sensor 102A shown as a single diode "D3" in FIGS. 2A through 2I. Although not illustrated, additional diodes can be included in reference voltage 102B as well as sensor 102A.

In addition, the detector may include one or more transistors in electrical communication with the sensor 102A and the voltage reference member 102B to form and/or power the bandgap reference circuit. The one or more transistors can include a combination of various transistors such as, for example, heterojunction bipolar transistors (HBT) (e.g., GaAs, Si, InP, SiGe, AlGaAs, InGaAs, GaN, and InGaN), NPN transistors, PNP transistors, junction-gate field-effect transistors (JFETs) (e.g., SiC), high electron mobility transistors (HEMT) (e.g., GaN, InP, AlGaAs, AlGaN, InGaAs/AlGaAs, AlGaN/InGaN, and combinations thereof), metal-semiconductor field-effect transistors (MESFET), metal-oxide-semiconductor field-effect transistors (MOSFET), and complementary metal-oxide-semiconductors (CMOS).

As a non-limiting example, FIG. 2A provides the sensor 102A, the voltage reference member 102B, and additional transistors represented as "M1"-"M4." In particular, MOSFETs can be used to bias the sensor 102A and the voltage reference member 102B and force the two branches to be equal such that any transient change in the voltage experienced at the sensor 102A can be measured as a voltage drop at the node before R1 and generated as an output of a signal of a subatomic particle.

FIGS. 2C through 2F show up to twelve MOSFETs used in the circuit design, represented as "M1"-"M12". Pairs of MOSFETs function to bias the diodes and force the branches between the sensor 102A and the voltage reference member 102B to be equal. In particular, M1-M12 throughout the various circuit designs of FIGS. 2C through 2F create a stable output as well as temperature independence in detecting transient subatomic particle interactions. Such network of diodes, MOSFETs and resistors can create a supply of current to the correct components of the system in order to create temperature independent outputs.

Figure 3A:
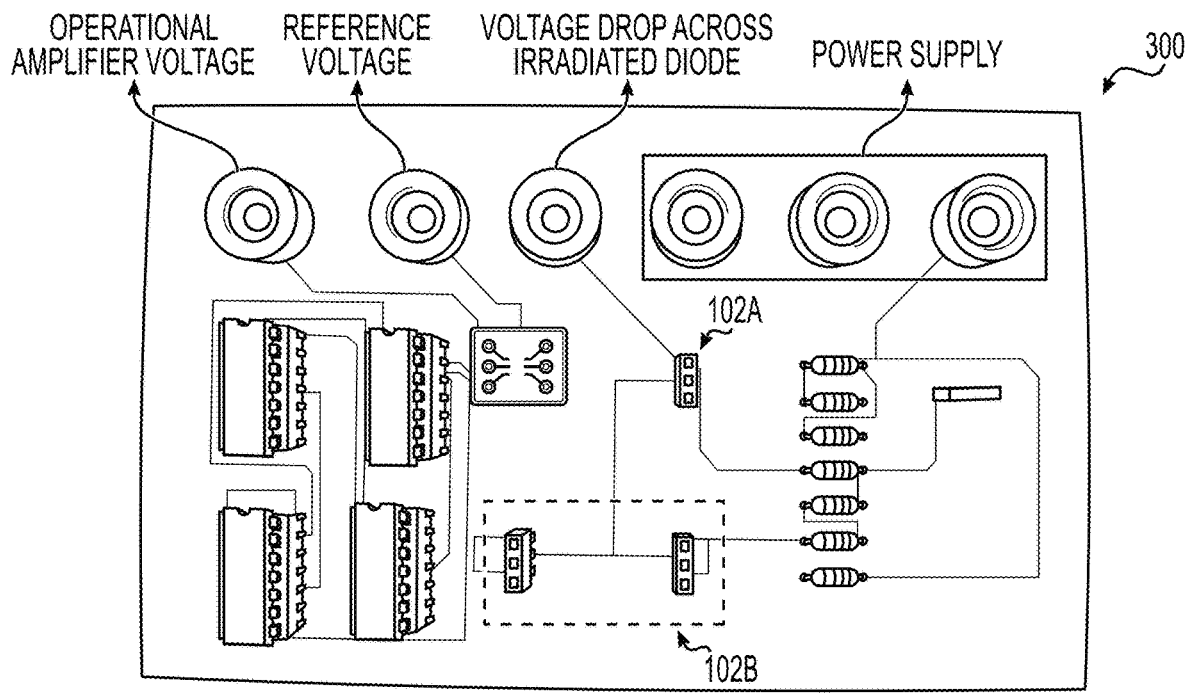
FIGS. 3A through 3C provide images of example printed and assembled circuit boards for work function reference circuits, in accordance with an exemplary embodiment of the present disclosure.
Figure 3B:
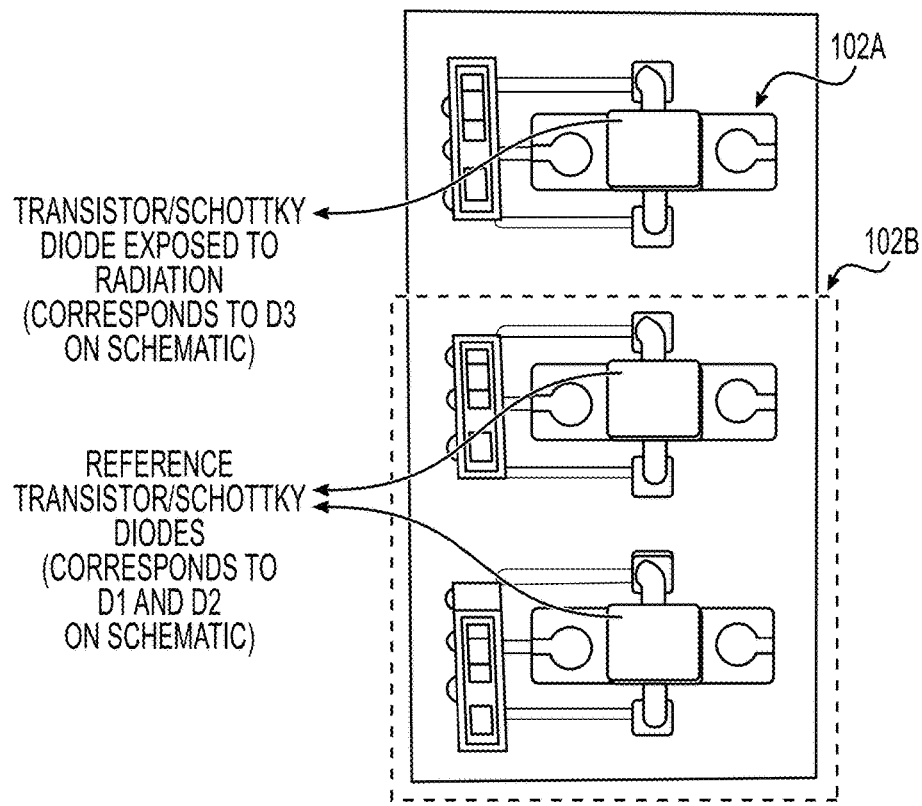
Figure 3C:
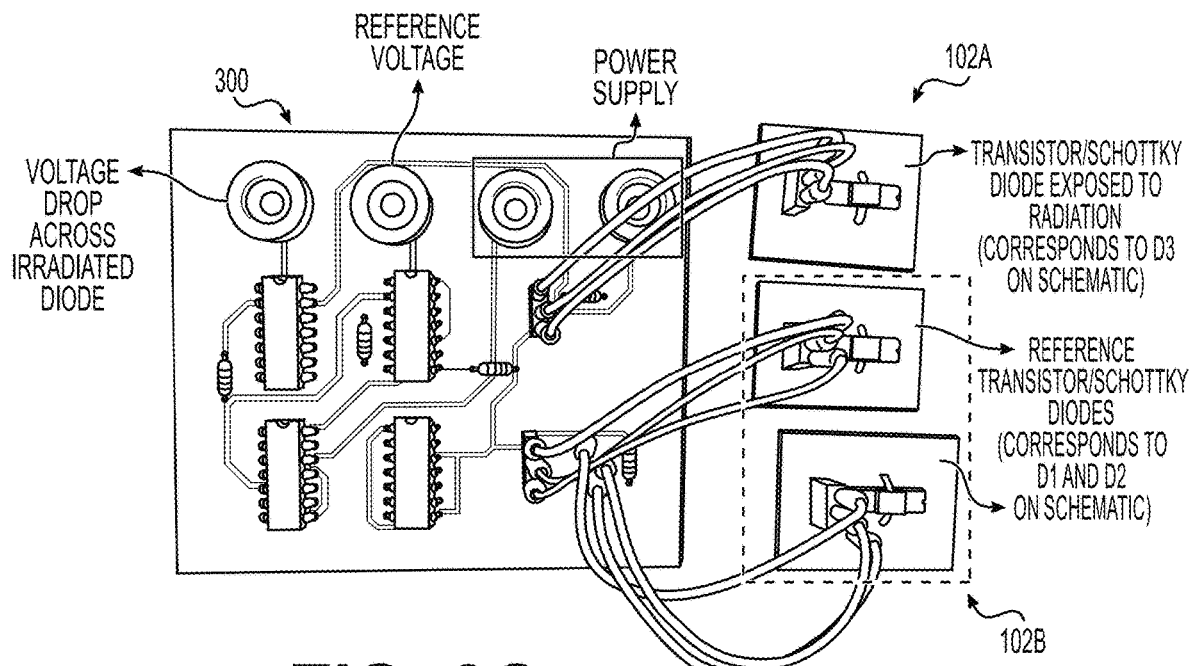
Figure 4A:
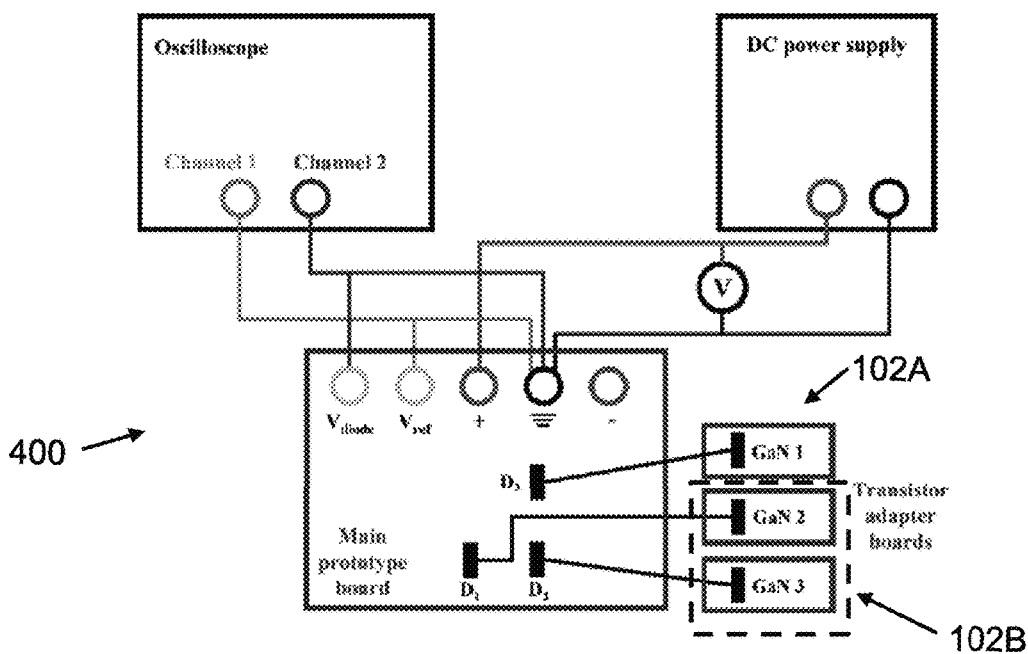
FIGS. 4A and 4B provide schematics of circuit board connections for work function reference circuits, in accordance with an exemplary embodiment of the present disclosure.
Figure 4B:
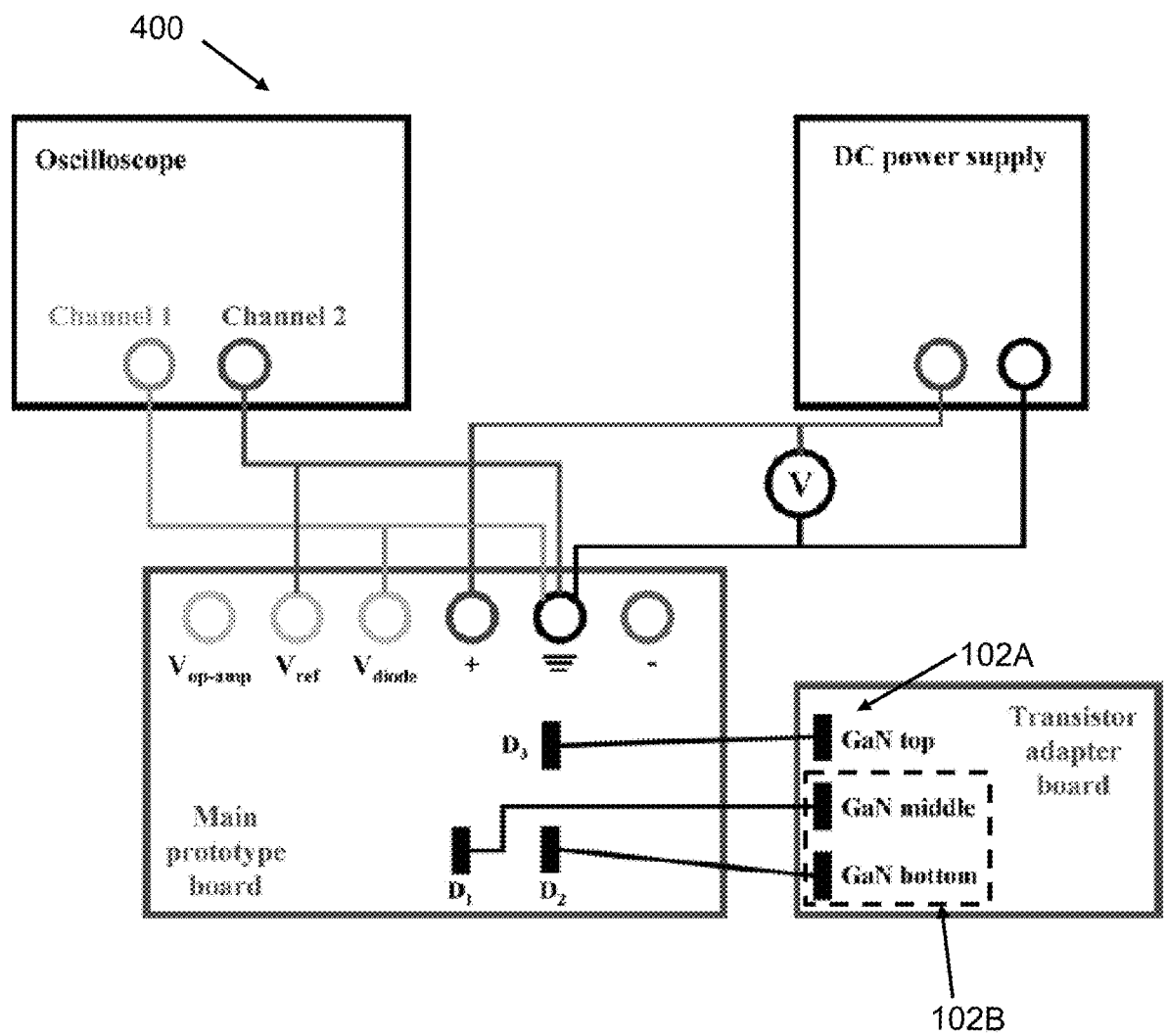
Figure 5A:
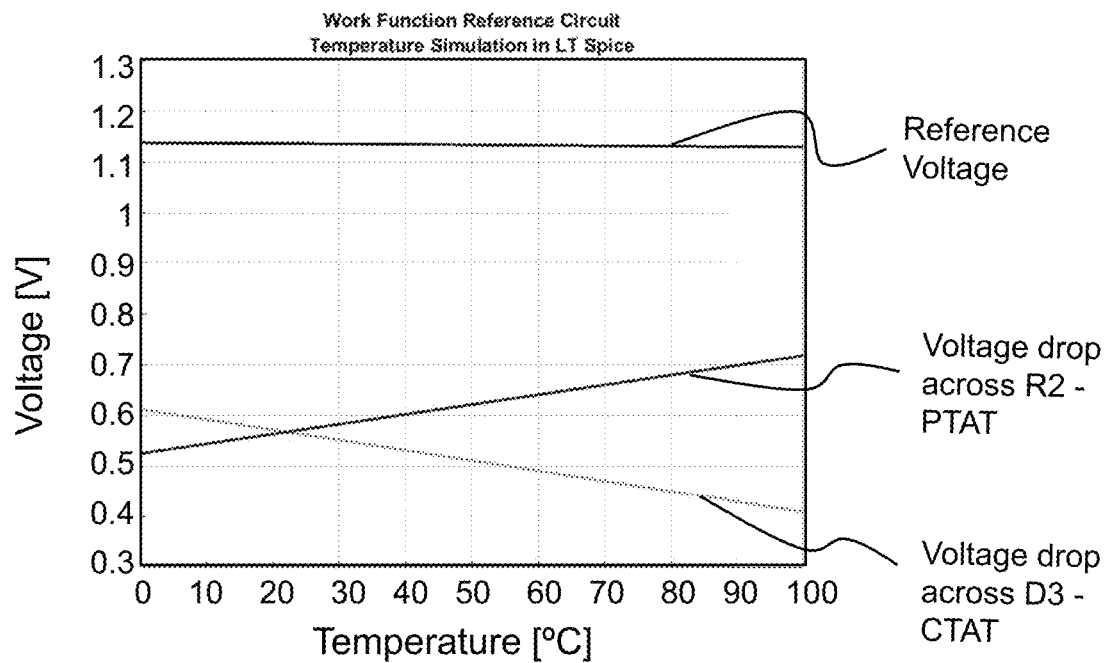
FIG. 5A provides a plot of temperature (° C.) versus voltage (V) for temperature simulations, from 0° C.-100° C., in accordance with an exemplary embodiment of the present disclosure.
Figure 5B:
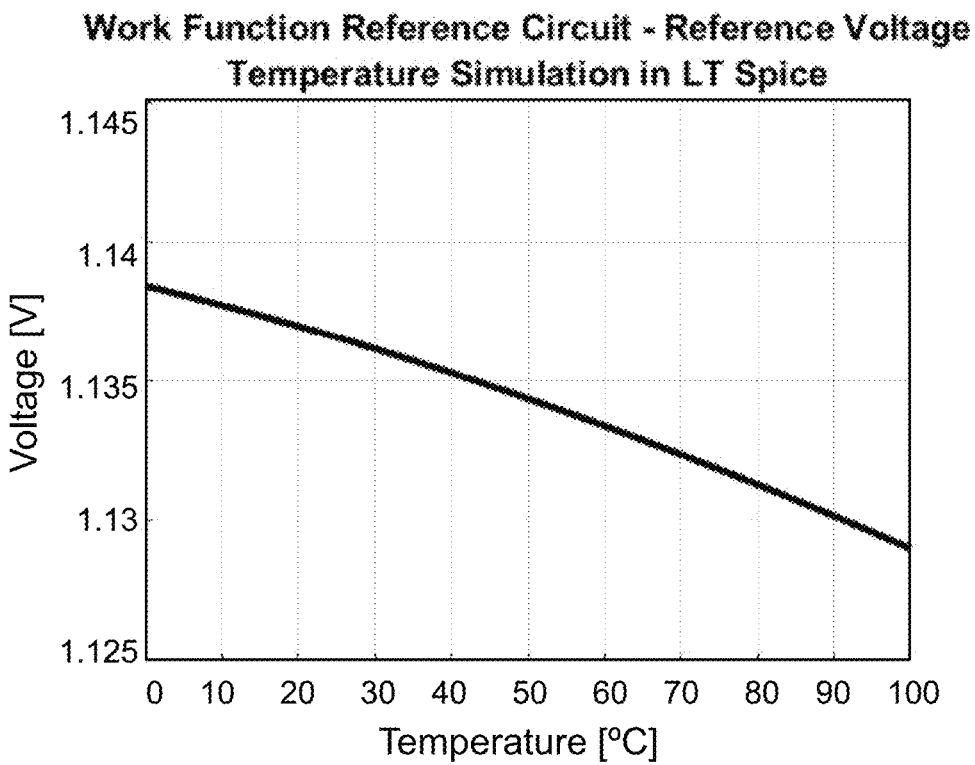
FIG. 5B provides a plot of temperature (° C.) versus voltage (V) for the reference diode voltage output of temperature simulations, from 0° C. — 100° C., in accordance with an exemplary embodiment of the present disclosure.

FIGS. 3A through 3C provide images of example printed and assembled circuit boards for work function reference circuits. In particular, FIG. 3A shows a specific example of a partially assembled circuit board displaying where sensor 102A and voltage reference member 102B, pictured in FIG. 3B, would be connected to form detector 300. FIG. 3C provides a fully assembled circuit board of detector 300. Similarly, FIGS. 4A and 4B provide schematics of circuit board connections for detector 400 forming a work function reference circuit with a sensor 102A and a voltage reference member 102B.

FIGS. 5A through 11B provide data establishing a detector having the circuit design as described supra can detect a change in a voltage output that is independent of temperature, and such change in voltage output is indicative of an interaction with a transient subatomic particle. Additional information is described below in the provided examples.

FIG. 12 is a flowchart illustrating a method 1200 of detecting one or more subatomic particles. The method 1200 can include providing 1202 a detector comprising a first diode and a second diode in electrical communication. The first diode can include a first semiconducting material abutting a first metal and forming a first junction. The second diode can include a second semiconducting material abutting a second metal and forming a second junction. The second diode can be configured to generate a reference measurement such that any change in voltage experienced by the first diode can be compared to the reference measurement. Method 1200 can further include exposing 1202 the first diode of the detector with one or more subatomic particles. Subatomic particles interacting with the first diode of the detector can range from single particles or clumps of two or more particles, such as an alpha particle or one or more neutrons. Method 1200 can further include measuring 1204 a change in work function in the first diode with respect to the reference measurement of the second diode. In addition, method 1200 can include outputting 1208 the change work function as a signal associated with interactions with the one or more subatomic particles. Method 1200 can stop after step 1208 or can further include transmitting such output measurement to a CPU, where computer instructions are processed. In some embodiments, the detector may wirelessly communicate, for example, via a Wi-Fi channel or other available network connection interface to an external/remote display.

Figure 13:
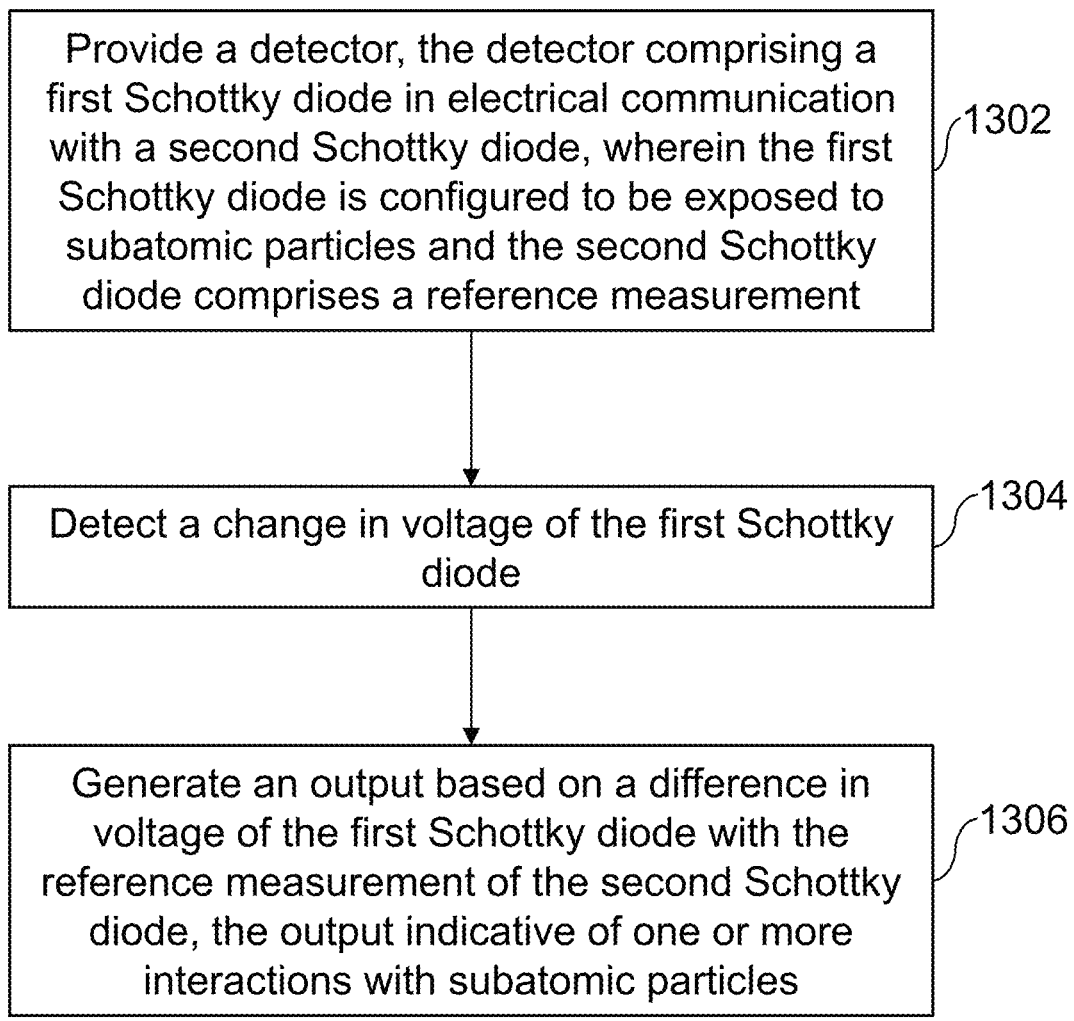
FIG. 13 is a flowchart illustrating a method of detecting a change in voltage indicative of one or more interactions with a subatomic particle, in accordance with an exemplary embodiment of the present disclosure.

FIG. 13 is a flowchart illustrating a method 1300 of detecting a change in voltage indicative of one or more interactions with a subatomic particle. In some examples, method 1300 can detect subatomic particles from a solid-state detector. In particular, method 1300 can include providing 1302 a detector as described supra. The detector can include a first Schottky diode in electrical communication with a second Schottky diode. The first Schottky diode can be configured to be exposed to subatomic particles and the second Schottky diode comprises a reference measurement. Subatomic particles interacting with the first Schottky diode can range from single particles or clumps of two or more particles, such as an alpha particle or one or more neutrons. Method 1300 can further include detecting 1304 a change in voltage of the first Schottky diode. The change in voltage can be indicative of an interaction with one or more subatomic particles in real time. Method 1300 can further include generating 1306 an output based on a difference in voltage of the first Schottky diode with the reference measurement of the second Schottky diode. The output can indicate that one or more subatomic particles did interact with the detector.

The following examples further illustrate aspects of the present disclosure. However, they are in no way a limitation of the teachings or disclosure of the present disclosure as set forth herein.

EXAMPLES

In some embodiments, this detector design can be based on the bandgap reference circuit, an analog circuit whose output can be stable under varying temperature, supply variation, and loading conditions. The circuit design can achieve this stability by incorporating two circuit elements whose temperature dependencies have equal but opposite coefficients.

Example 1

Diode Designs

In certain embodiments, a new design for solid state particle detectors (SSDs) can utilize transient signatures in circuit output as a mechanism for particle detection. In this device design, gallium nitride (GaN) and aluminum gallium nitride (AlGaN) can be layered materials, which are both semiconducting and piezoelectric, and can be investigated to form components of the detector. This device can take the form of an analog circuit whose design is based on the Bandgap Reference (BGR) circuit, an analog circuit whose output can be specifically designed to be independent of temperature, supply variations, and loading. Utilizing this design can provide a stable DC output voltage against which can be measured transient signals that arise from particle interactions with the detector. In some embodiments of this technology, the output of the circuit can be proportional to the Schottky barrier height (SBH) of a GaN/AlGaN Schottky diode; this voltage can serve as the stable DC output against which transient signals are measured.

In other embodiments, it can perform particle detection utilizing a single detector from a transient signal created during a particle-detector interaction, as measured against the detector's stable DC output. It can also be expected that the device response will be unique for each type of particle. The signal features can carry information unique to incident particle characteristics include signal shape, decay time and frequency spectra. In some embodiments, the method can extract measurement of particle energy as well as particle momentum of an incident particle.

In some non-limiting embodiments, the scattering cross-section of neutrons can be dependent on neutron energy. It can be expected that signatures will depend on neutron energy. The signature can appear different depending on which atomic species the neutron scatters off, an effect due to the dependence of neutron scattering cross-section on target atom identity. Additionally, piezoelectric materials GaN and AlGaN can be highly anisotropic, such that the angle of incidence, device orientation, and impact location may affect the transient signature.

In some embodiments, an incoming particle can scatter off a nucleus in the GaN/AlGaN lattice of the Schottky diode component of the circuit. During this scattering process, the particle can transfer some of its energy or momentum to the lattice, which can cause a displacement of one of the nuclei in the lattice. At this point, one of two processes can occur.

If an energy amount below the threshold displacement energy can be transferred during the scattering process, the atom may be slightly displaced from its lattice site, but due to conservation of energy and the restoring force of its bonds to neighboring atoms, the atom can oscillate back to its equilibrium position in the lattice. For GaN, experiments and molecular dynamics can determine that the threshold displacement energy varies with direction and incident particle energy, with average values of 73.2 eV and 32.4 eV for gallium and nitrogen respectively. Its neighbors can experience Coulombic force that temporarily displaces them from their lattice site, but these neighbors can also oscillate back to their equilibrium positions. In this manner, a phonon wave can be generated in the piezoelectric crystal that propagates for a longer period of time that the lifetime of the detection event.

If sufficient energy or momentum is transferred, the atom can be pushed out of its lattice site and travels in the lattice as a free atom; such an atom can be displaced from its lattice site by irradiation is called a primary knock-on atom (PKA). As the PKA travels through the lattice, it may scatter off other nuclei, transferring energy until it stops some distance later at an interstitial site. During these later interactions, a similar process of generating either a knock-on atom (now known as a secondary knock-on atom) or only temporarily displacing atoms can occur. As such, each PKA can have the same type of phonon-wave-generating effect as the initial event as it loses kinetic energy and can come to rest at an interstitial site.

In both scenarios, a phonon wave can be generated in the lattice. As these phonon waves propagate, they can generate an internal stress-strain field, which can induce localized polarization via the piezoelectric effect. When these phonon waves intersect with the metal-semiconductor interface of a Schottky diode, they can cause local variations in the Schottky barrier height (SBH). The local variations in turn can result in a transient signal in the output of the device, which can be calibrated to output a voltage proportional to the Schottky barrier height of GaN. Particle characteristics like identity, energy, angle of incidence, and impact location all can affect the interactions, which in turn can result in changes of the observed transient signal.

Another unique element of this work is the ability to detect neutrons in a solid state detector without a neutron-reactive material encasing or being embedded in the detector. In some embodiments, this detector can extract information from transient events that occur in the GaN devices from momenta transfer.

Increased sensitivity and potential for in situ measurements combined with its small footprint means that this design can lend itself well to radiation dosimetry. In some embodiments, this device can be manufactured on an integrated circuit (IC). Such an IC could easily be incorporated into a personal dosimeter design, like the thermo-luminescent dosimeters worn by radiation workers. The size of this detector means that it can be utilized in environments that require equipment with small footprints. Additionally, because GaN is a rad-hard material, this detector design can be deployed in a variety of environments. Another application exists in the realm of national security: this design could be implemented in efforts to track and verify special nuclear material for nuclear nonproliferation goals, likely in parallel with other detectors. In a similar application, such a device could be implemented in urban radiation detection networks.

Additionally, in some embodiments, an analog circuit design can have VGG as the applied voltage. I1 and I2 can be idealized identical current sources; these current sources can be produced by a current mirror design described later. The operational amplifier can provide feedback to resistors R1 and R2 that forces the voltage at the node above DS2 to equal the voltage at the node above R3. The Schottky diode labeled DS2 can be the diode in the circuit which can be irradiated. The other Schottky diode labeled DS1 can be part of the temperature cancellation part of the circuit. The signal from both Schottky diodes can be input to the operational amplifier and produce an output VDS2. The signal from Schottky diode labeled DS2 can go into another operational amplifier and produces the desired output, Vref. The extra wires on the operational amplifiers can keep the gain controlled and prevent unnecessary feedback. Without these feedback loops, the output of the operational amplifier can just oscillate, and the output can be unrelated to the input.

In other embodiments, the circuit design can include MOSFET M7 and resistor R5, which can provide current to the loop of transistors containing MOSFETs M1, M2, M3, and M4. Once sufficient voltage is recorded shortly after startup at the output the MOSFETs labeled M5, M6, M8 and M11 and resistor R4 can form the current mirror that supplies the operating current. The current mirror can bias the differential pair of MOSFETs M1 and M2. The other two MOSFETs in that loop, M3 and M4 can be a matched pair that provide an active load on M1 and M2. This loop of transistors containing M1, M2, M3, and M4 can try to force the voltage at the node between R2 and R3 and the node between R1 and the single GaN Schottky diode can be equal. When an event occurs in the single GaN Schottky diode functioning as the sensor 102A, the circuit can try to compensate for the voltage change as it returns to steady-state, a process which is reflected in the output reference voltage. The other transistors not-yet-described are MOSFET M9, which can act as a cascode stage to reduce the influence of power supply variations on the reference voltage at the output, and MOSFETs M10 and M12 which can act to amplify the difference in the voltage at the two aforementioned nodes.

Example 2

Circuit Designs

Base analog circuit designs have output voltage stability independent of temperature variations, supply variations, and loading. The invention disclosed herein can demonstrate transient signals observed superimposed on a steady-state DC output voltage. Implementing a temperature-compensating design from the beginning based on bandgap reference circuit design provides the analog tools needed to create the solid state detector.

Figure 2B:
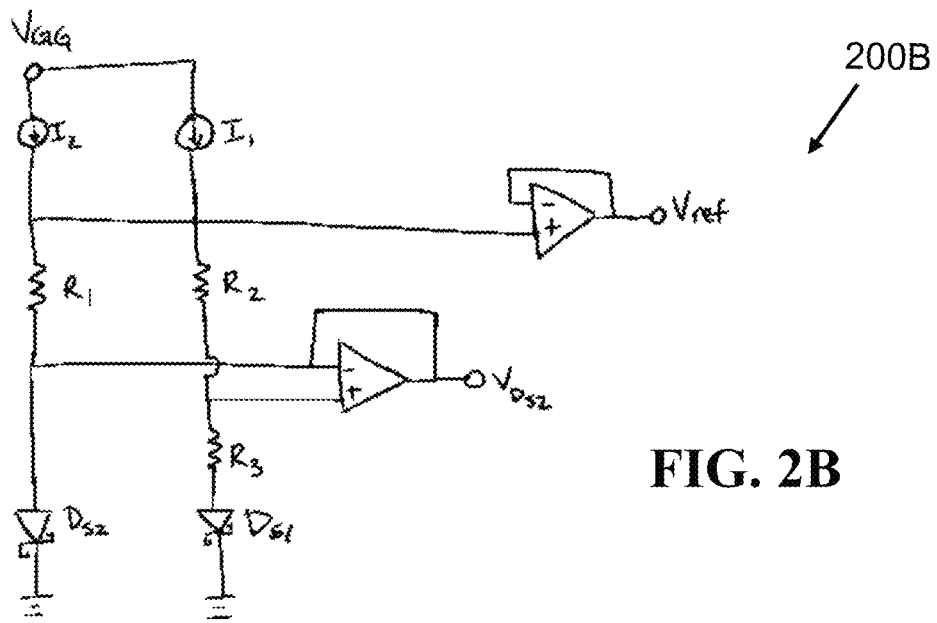
Figure 2C:
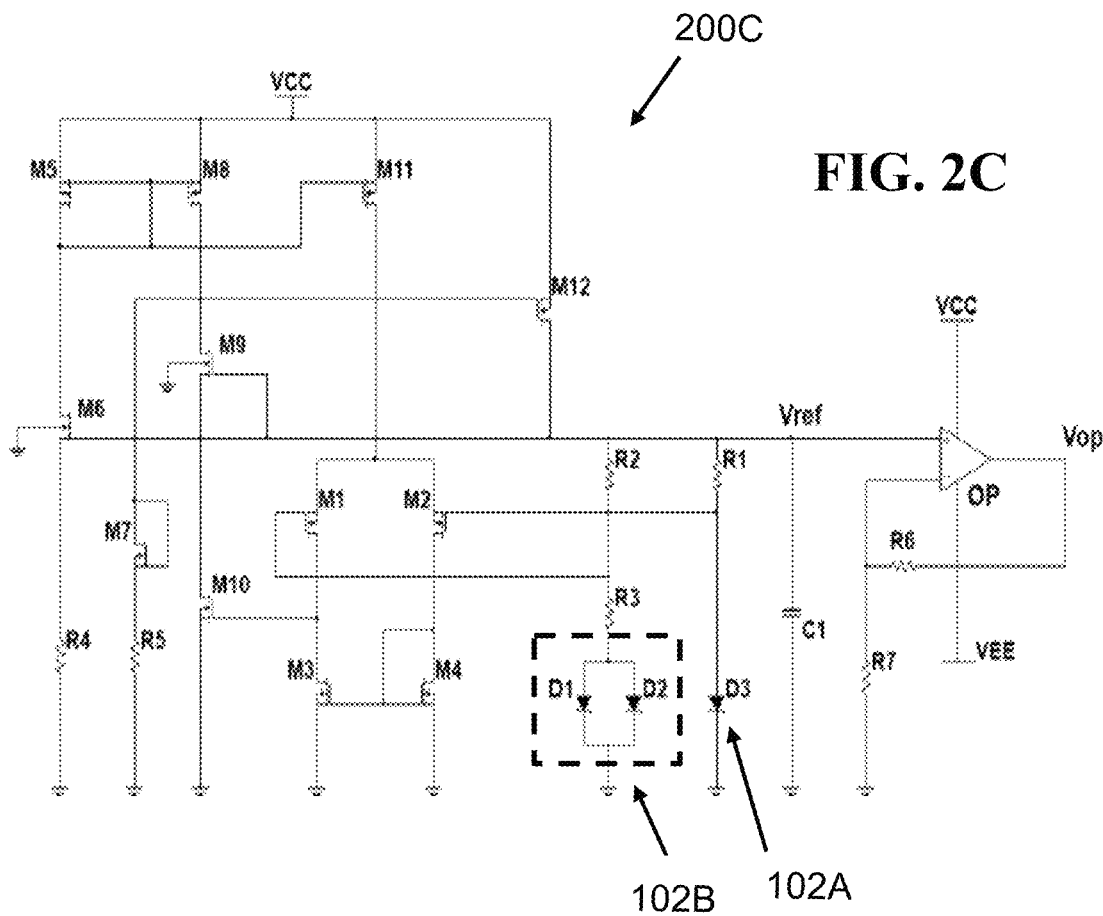

As shown in FIG. 2B, $V_{GG}$ is the applied voltage. $I_1$ and $I_2$ are idealized identical current sources; these current sources will be produced by a current mirror design described later. The operational amplifier provides feedback to resistors $R_1$ and $R_2$ that forces the voltage at the node above DS2 to equal the voltage at the node above $R_3$. The Schottky diode labeled $D_{S2}$ is the diode in the circuit that will be irradiated. The other Schottky diode labeled $D_{S1}$ is part of the temperature cancellation part of the circuit. The signal from both Schottky diodes are input to the operational amplifier and produce an output $V_{DS2}$. The signal from Schottky diode labeled $D_{S2}$ goes into another operational amplifier and produces the desired output, $V_{ref}$. The extra wires on the operational amplifiers keep the gain controlled and prevent unnecessary feedback. Without these feedback loops, the output of the operational amplifier will just oscillate, and the output will be unrelated to the input.

In FIG. 2B, the capacitor provides frequency compensation; however, it may also dampen the transient signals in the experiment, so it was removed. The operational amplifier was also removed. An updated version of the schematic is shown in FIGS. 2C through 2F.

Figure 2D:
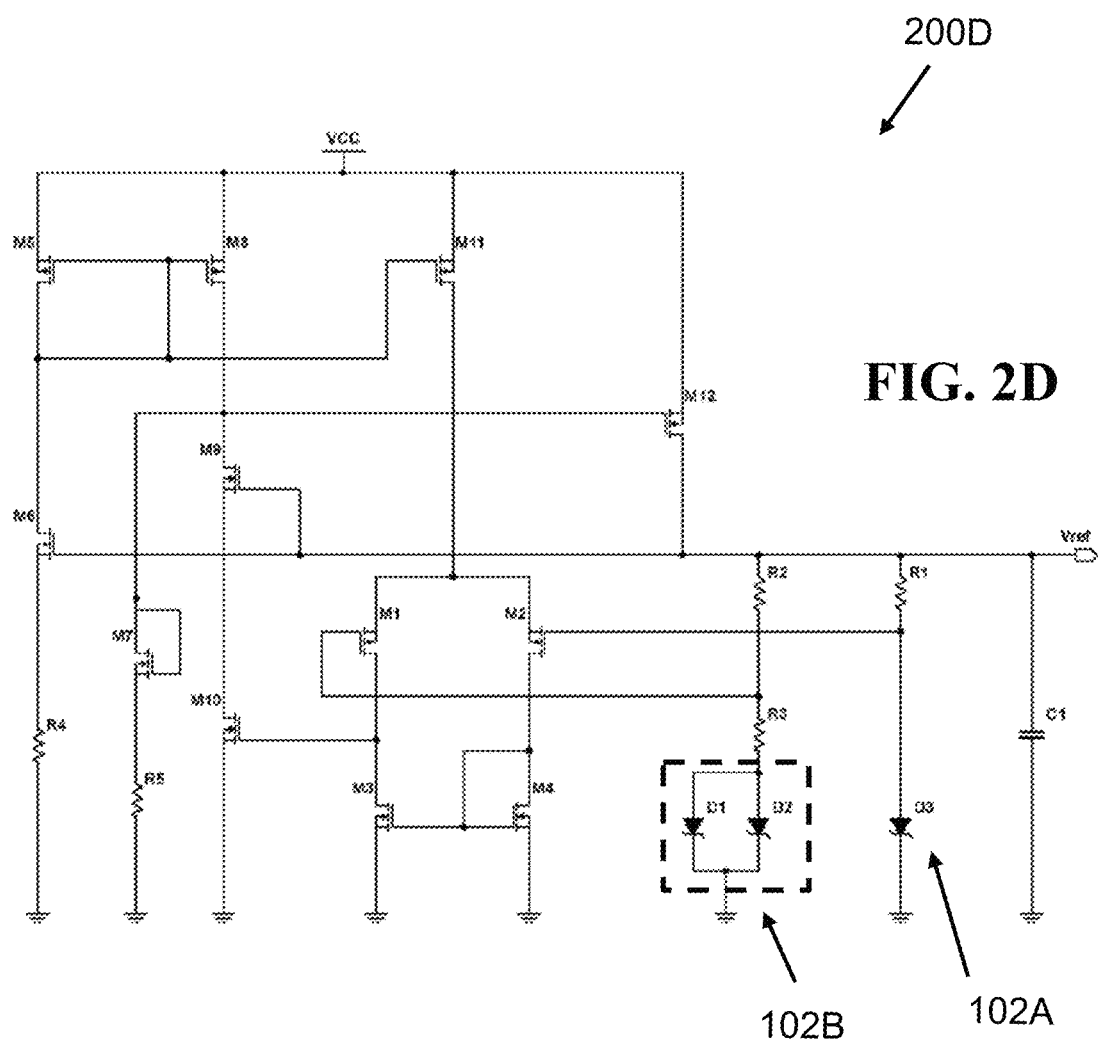
Figure 2E:
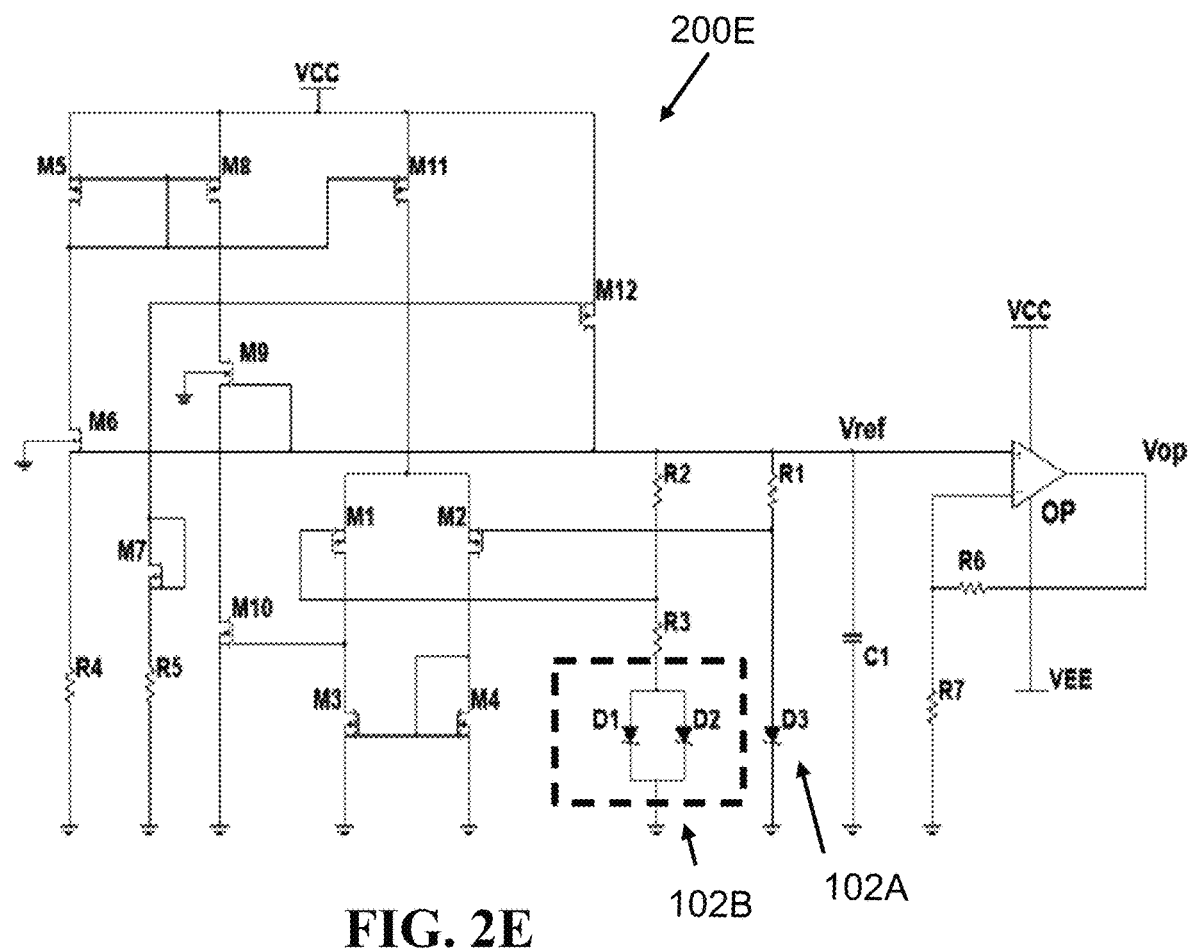
Figure 2F:
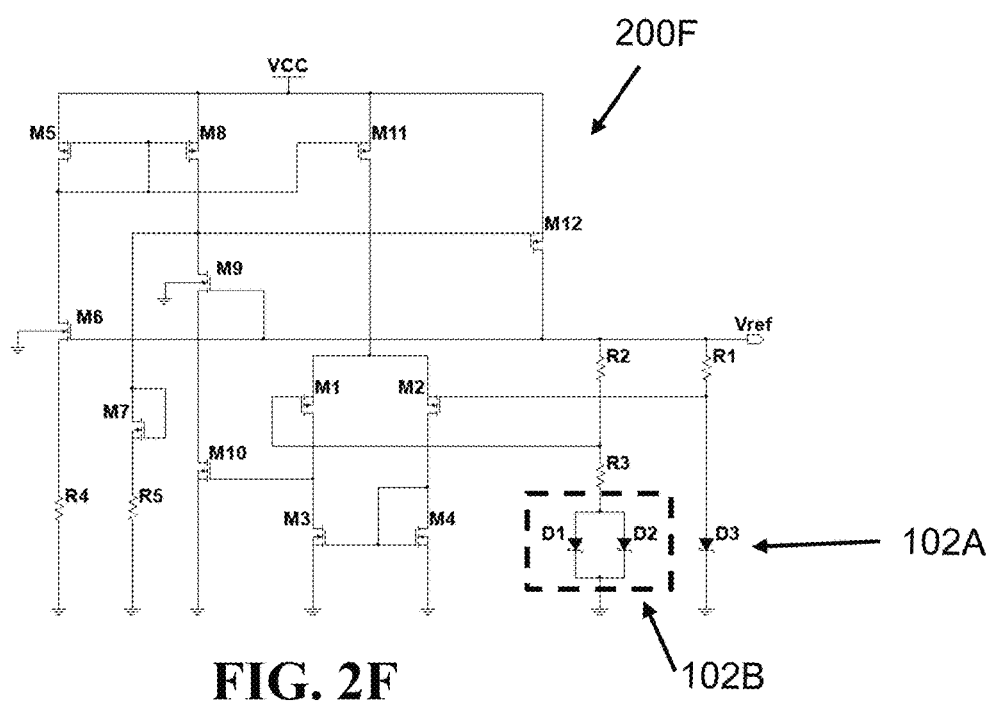
Figure 2G:
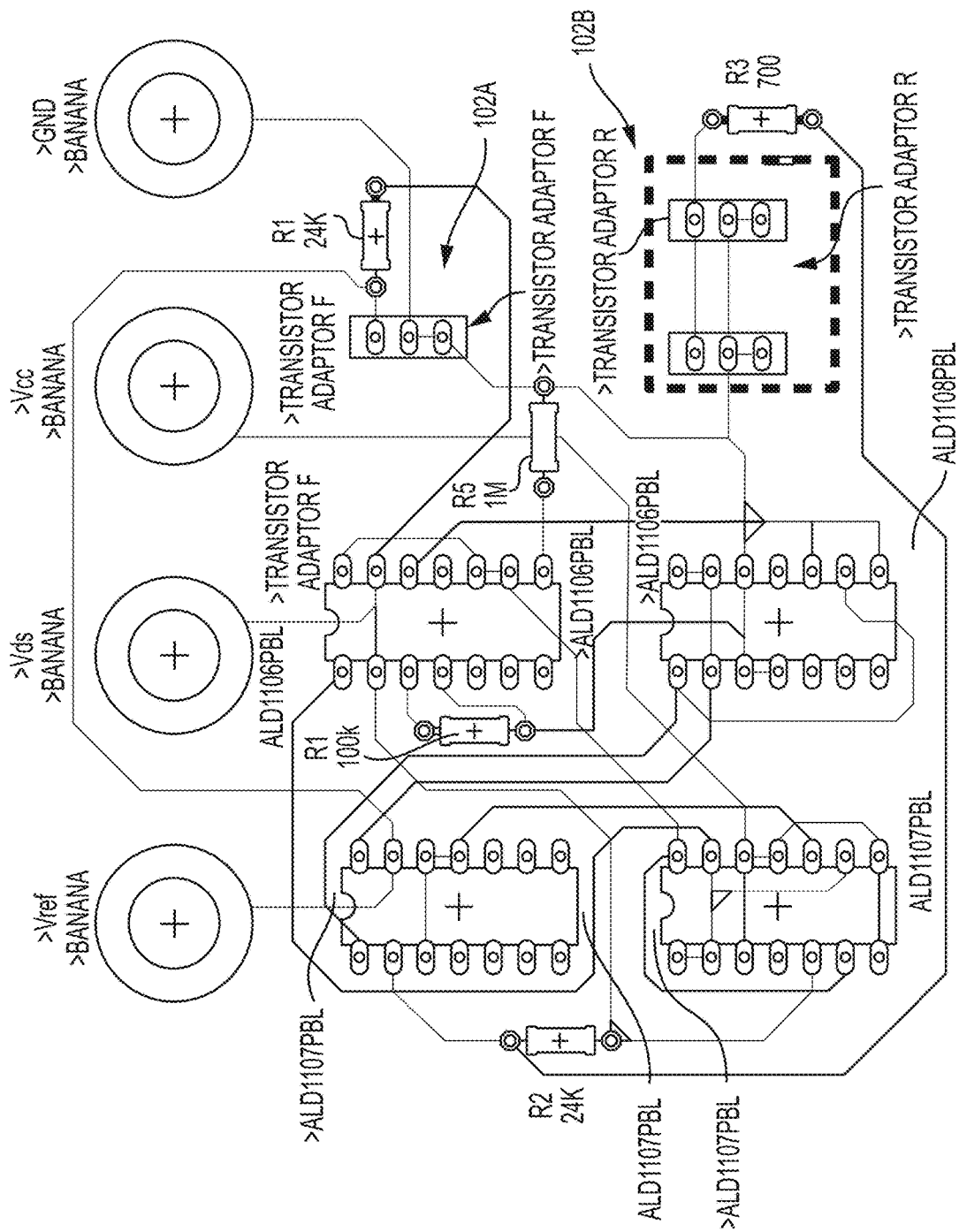
Figure 2H:
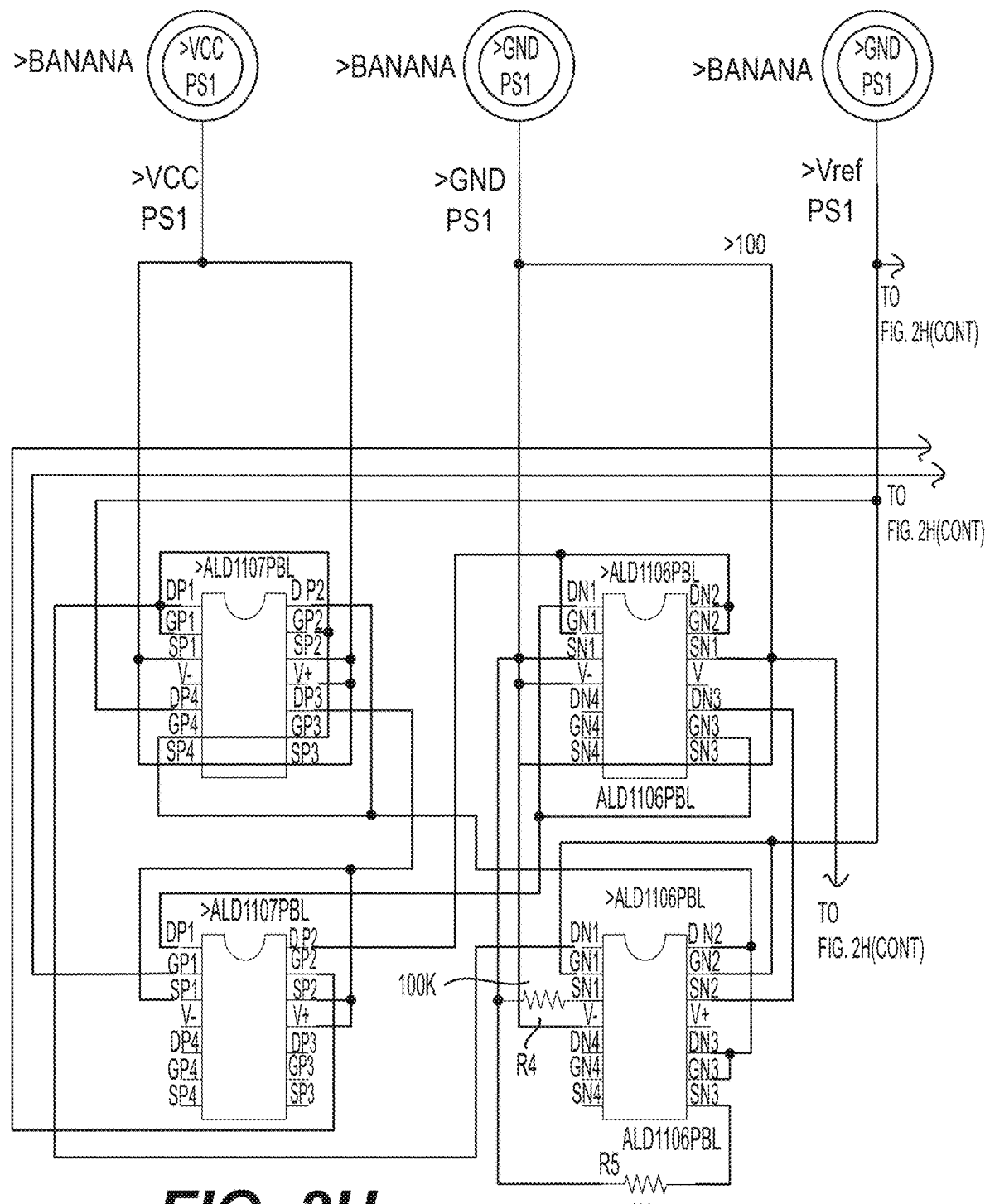
Figure 2H:
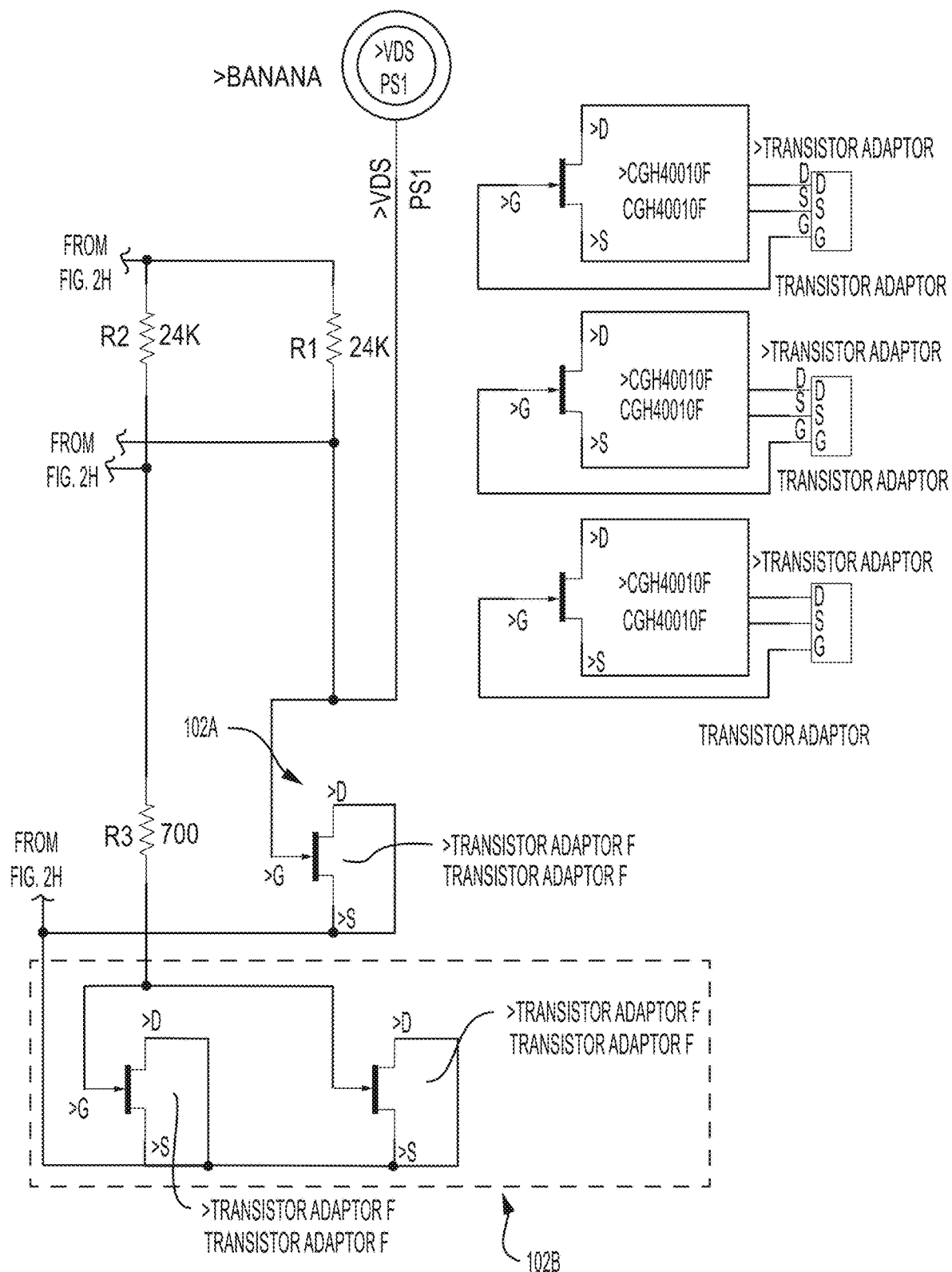
Figure 2I:
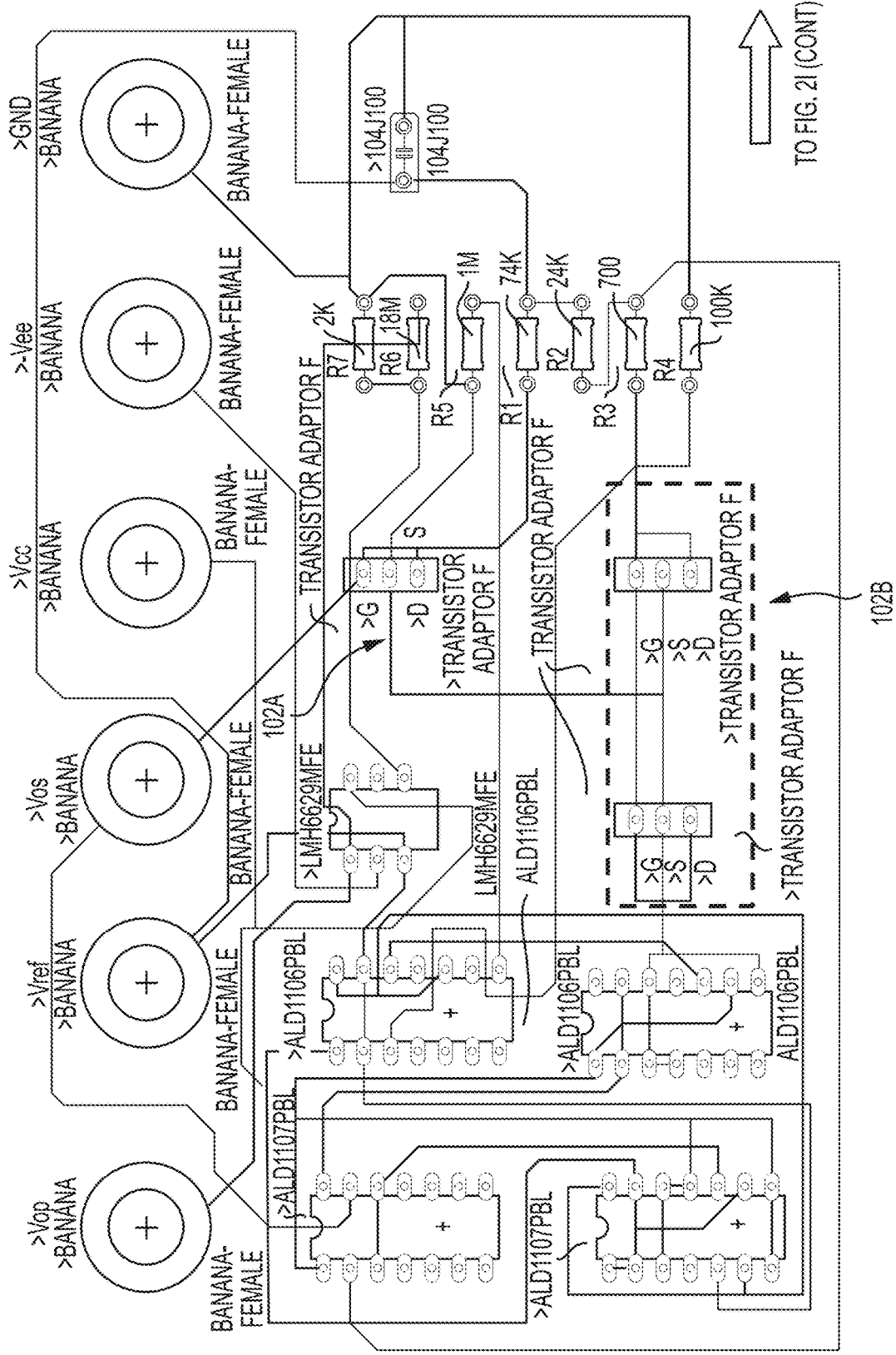
Figure 2J:
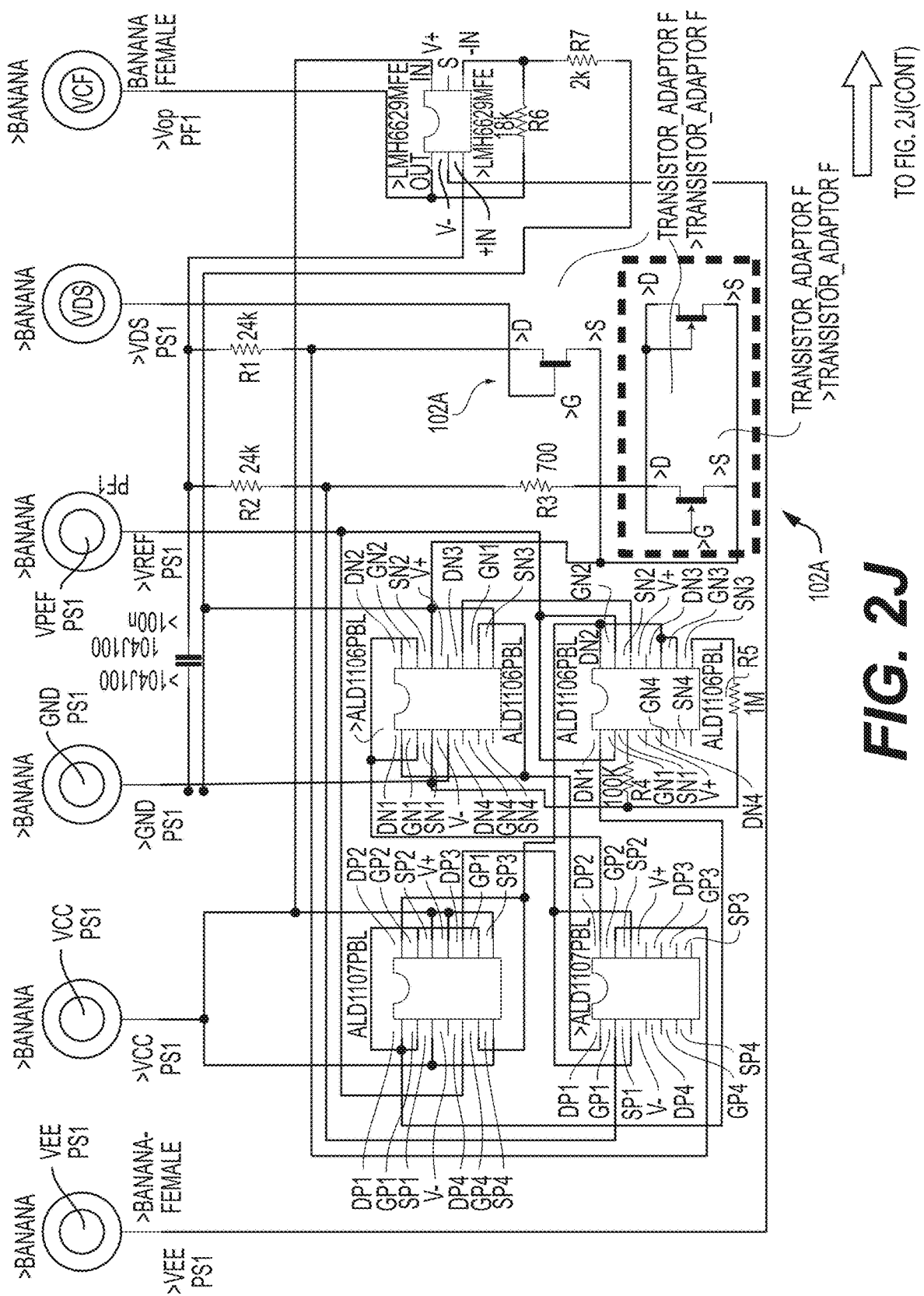
Figure 2J:
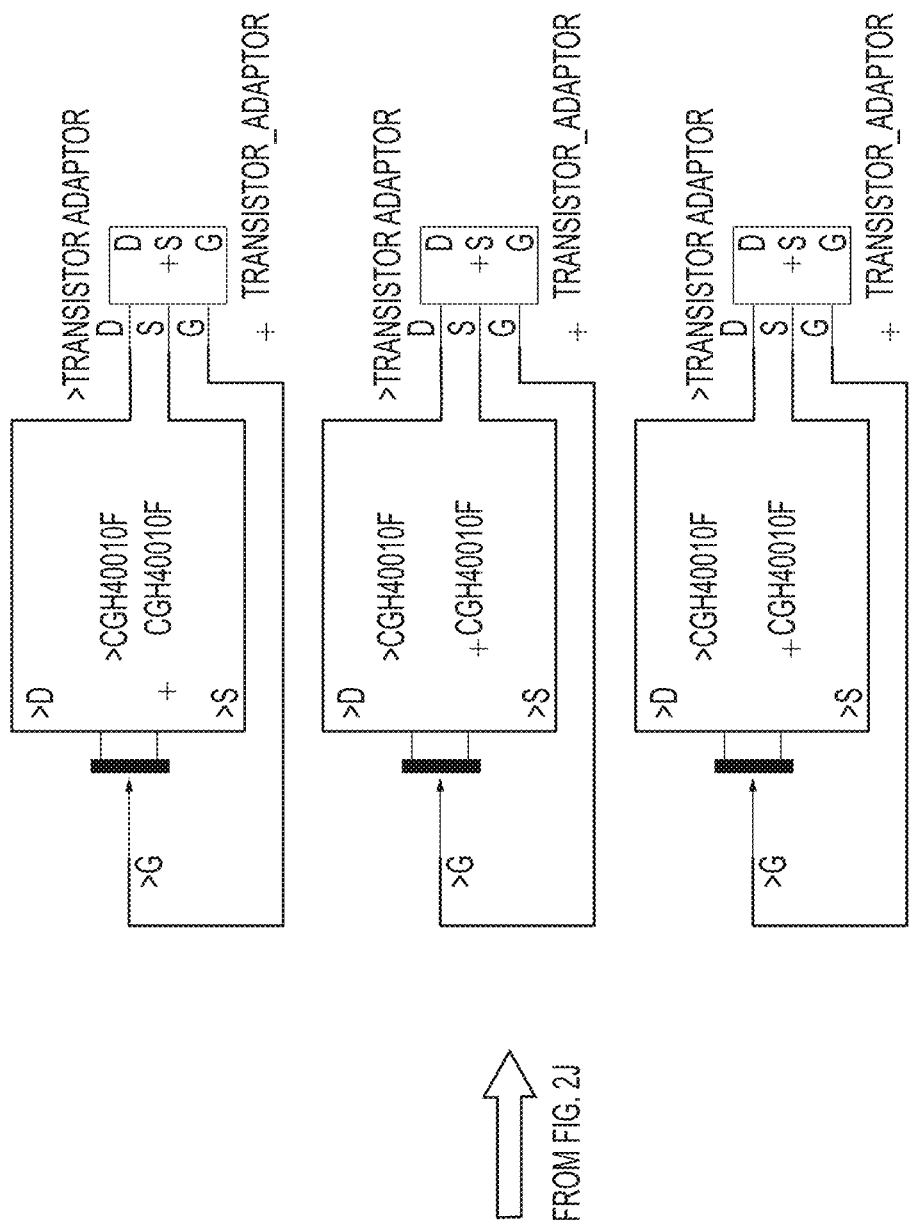

The circuit design that was used for the first prototype is shown in FIG. 2D. MOSFET M7 and resistor R5 provides current to the loop of transistors containing MOSFETs M1, M2, M3, and M4. Once sufficient voltage is recorded shortly after startup at the output the MOSFETs labeled M5, M6, M8 and M11 and resistor R4 form the current mirror that supplies the operating current. The current mirror biases the differential pair of MOSFETs M1 and M2. The other two MOSFETs in that loop, M3 and M4 are a matched pair that provide an active load on M1 and M2. This loop of transistors containing M1, M2, M3, and M4 tries to force the voltage at the node between R2 and R3 and the node between R1 and the single GaN Schottky diode to be equal. When an event occurs in the single GaN Schottky diode, the circuit tries to compensate for the voltage change as it returns to steady-state, a process which is reflected in the output reference voltage. The other transistors not-yet-described are MOSFET M9, which acts as a cascade stage to reduce the influence of power supply variations on the reference voltage at the output, and MOSFETs M10 and M12 which act to amplify the difference in the voltage at the two aforementioned nodes.

One major difference occurs between the circuit disclosed herein and prior circuits: a fifth resistor R5 was added in series with MOSFET M7. In prior analog circuits, it is assumed that the circuit is fabricated as an integrated circuit, allowing designers control over parameters like MOSFET dimensions. In some examples, the resistor R5 can compensate for the fact that M7 currently matches the dimensions of other transistors in the circuit.

Consider the voltage loop from the reference voltage through R1 and the single GaN Schottky diode, labeled D3. Kirchoff's Voltage Law for this loop yields:

$$V_{ref} = V_{R_1} + V_{D_3} \quad \text{(Eq. 1)}$$

However, because the circuit tries to keep the voltage at the two previously-described nodes, the path taken for Kirchoff's Voltage Law can be chosen and Equation 1 can be rewritten as:

$$V_{ref} = V_{R_2} + V_{D_3} \quad \text{(Eq. 2)}$$

The current through resistor R2 is related to the voltage across R2 by:

$$V_{R_2} = R_2 \cdot I_{R_2} \quad \text{(Eq. 3)}$$

The current is split at the node between R2 and R3. However, the second wire goes to the gate of MOSFET M1 which has high impedance (idealized, this gate has infinite resistance and allows no current); therefore, the current through resistor R3 should equal the current through resistor R2. Therefore, the current can be written through R2 as:

$$I_{R_2} = I_{R_3} = \frac{V_{R_3}}{R_3} \quad \text{(Eq. 4)}$$

Combining Equations 3 and 4 allows the first term of Equation 2 to be rewritten as:

$$V_{ref} = \frac{R_2}{R_3} V_{R_3} + V_{D_3} \quad \text{(Eq. 5)}$$

Now, the voltage loop that includes the single GaN Schottky-diode-connected HEMT, resistor R3, and the two GaN Schottky-diode-connected HEMTs can be considered to be in parallel. Kirchoff's Voltage Law for this loop gives an expression for the voltage across R3:

$$V_{R_3} = V_{D_3} - V_{D_1 D_2} = \Delta V_{SD-GaN} \quad \text{(Eq. 6)}$$

In this equation, the voltage across both of the GaN Schottky-diode-connected HEMTs is the same because they are connected in parallel. The change that arises from two diodes in that part of the circuit is that the slope of the voltage as a function of temperature will be different because they are effectively doubling the area, changing the current density. Call this difference $\Delta V_{SD-GaN}$, which corresponds to $\Delta V_{BE}$ in a traditional bandgap reference circuit.

Substituting Equation 6 into Equation 5 gives a final expression for the reference voltage:

$$V_{ref} = \frac{R_2}{R_3} \Delta V_{SD-GaN} + V_{D_3} \quad \text{(Eq. 7)}$$

In this equation, the voltage drop across D3 is negative and fixed for a given circuit configuration; it is the complementary to absolute temperature (CTAT) element: as temperature increases, voltage decreases. The voltage difference $\Delta V_{SD-GaN}$ is positive and fixed for a given circuit configuration; it is the proportional to absolute temperature (PTAT) element: as temperature increases, voltage decreases. The values of the resistors R2 and R3 are tuned through the simulation process to scale the PTAT such that its temperature dependence is equal but opposite to the CTAT.

Relating this expression for the reference voltage to the Schottky barrier height involves device physics. The Shockley diode equation is given by Equation 8.

$$I = I_s \left[ \exp\left(\frac{V}{nV_T}\right) - 1 \right], \quad \text{(Eq. 8)}$$

where I is the current through the diode; V is the voltage across the diode; n is the ideality factor; $V_T$ is the thermal voltage given by Equation 9, where k is the Boltzmann constant and q is the electron charge; and $I_s$ is the saturation current from thermionic emission for Schottky diodes, given by Equation 10, where A* is the material-dependent Richardson's constant and $\Phi_B$ is the Schottky barrier height.

$$V_T = \frac{kT}{q} \quad \text{(Eq. 9)}$$

Changes induced in the Schottky barrier height $\Phi_B$ as a result of particle interaction with the GaN lattice will appear across the reference voltage as related through Equations 10 and 8.

$$I_s = A^* T^2 \exp\left(-\frac{q\Phi_B}{kT}\right) \quad \text{(Eq. 10)}$$

Example 3

Circuit Simulations

A circuit simulation program named LTspice was utilized to investigate circuit performance. The process began by building the circuit with generic components based on the circuit design. Generic electronic elements were added to the simulation by going to the Edit menu and clicking on "Component." From there, a library of component elements opened for selection. Once the electronic components were added to the simulation, each element was edited to match the name in the circuit schematic and input other information like dimensions for the MOSFETs and resistance values for the resistor.

Single right clicking on a component allowed a change to the model used for that component. Many of the electronic elements in the circuit described herein are standard components whose models exist in LTspice's built-in library. For other elements, namely the MOSFETs, a spice netlist describing the device model was imported, generated using information from the parts' datasheets. These imported models were incorporated as a text entry following the netlist syntax for the component type, which LTspice converts to readable models as part of the simulation.

The Schottky-diode-connected GaN transistors utilized in this design are fabricated by Wolfspeed, a Cree company. Cree has an industry reputation for producing high-quality device models for their products. However, their proprietary device models are only available for use with the circuit simulation programs Microwave Office and Advance Design System (ADS). For these simulations, a standard 2N3906 PNP bipolar junction transistor was used in a diode-connected configuration; the model for this device is built into LTspice. The primary impact on the simulations this choice has is in the value of the reference voltage at the output; rather than providing the bandgap energy of gallium nitride, it would be expected to see 1.2 V matching the bandgap energy of silicon.

The final step in generating the circuit design in LTspice is to add the wire connections between components as well as indicate any component that is grounded. LTspice has a wire tool that allows for connecting different components, and a ground tool that specifically indicates where the ground points are.

Once the circuit was built in LTspice, temperature simulations were run. Temperature is a built-in parameter that can be swept, with default units of ° C. The spice directive syntax for LTspice controls the simulation, and requires the following elements:

".step variable varStart varEnd stepSize"

To sweep over temperature from 0° C. to 100° C. with a step size of 0.1° C., the spice directive ".step temp 0 100 0.1" was entered. The run button on the toolbar automatically runs the simulation over the given parameter(s) as specified by the spice directive(s).

From the new window that opens as the simulation runs, what to plot is chosen by right clicking and selecting "Add Traces." A dialog box opens with all of the possible node voltage and device currents that are recorded during the simulation. Three node voltage and device currents were selected: the reference voltage, a named node V(vref); the voltage across the irradiated diode V(vbe2), which is the PTAT; and the scaled CTAT, defined as V(vref)-V(vrefp), where V(vrefp) is the named node between R3 and R2. The simulation data is provided in FIG. 5A, with a zoomed in version of the reference voltage shown in FIG. 5B. The output of the circuit simulations are not straight lines; however, the temperature dependence can be approximated by using MATLAB's built-in fitting function polyfit to fit a line (n=1) to the diode voltage as a function of temperature and the reference voltage as a function of temperature. Doing this calculation yields a slope of −2.02 mV/° C. for the diode voltage, and an improved slope of −94.5 μV/° C. for the reference voltage.

Example 4

Effects of Temperature on the Circuit

Figure 6A:
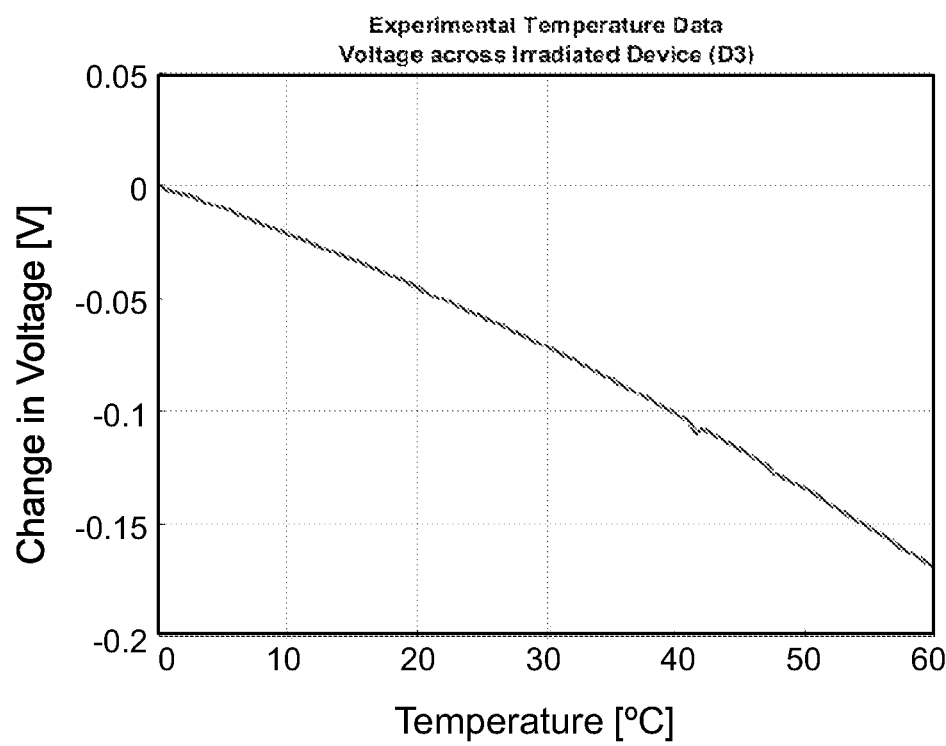
FIG. 6A provides a plot of temperature (° C.) versus change in voltage (V) for an irradiated GaN device under environmental chamber temperature testing of the circuit board of FIG. 2D, in accordance with an exemplary embodiment of the present disclosure.

The experimental temperature data measuring the voltage across the irradiated device (labeled D3 in the circuit schematics) is shown in FIG. 6A. From this data, a slope of −2.626 mV/° C. was measured, which agrees with values expected for temperature dependence of semiconductor devices.

Figure 6B:
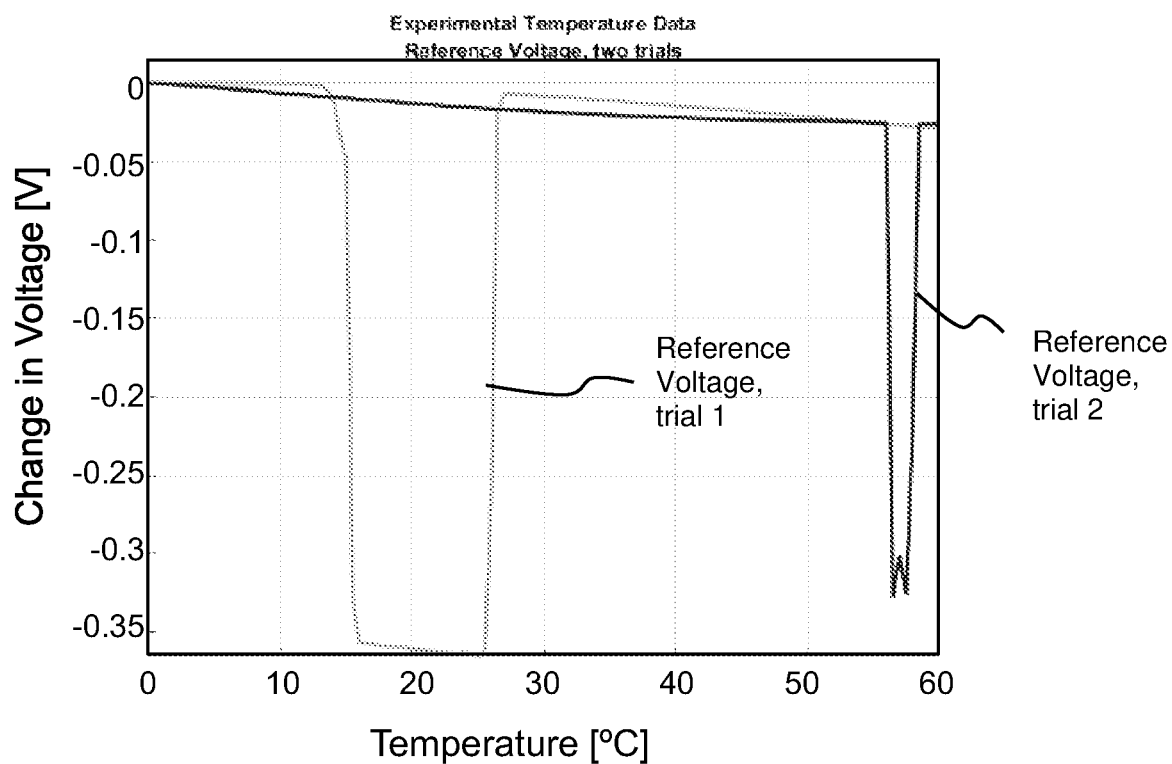
FIG. 6B provides a plot of temperature (° C.) versus change in voltage (V) for two trials of a reference GaN device under environmental chamber temperature testing of the circuit board of FIG. 2D, in accordance with an exemplary embodiment of the present disclosure.

There are two trials of experimental temperature data measuring the reference voltage, shown in FIG. 6B. The first trial experienced an interruption of unknown cause during the middle of the experiment, resulting in a large change of −352 mV over 2° C. (from 14° C. to 16° C.), and another large of 358 mV over 1.5° C. (from 25.5° C. to 27° C.). A similar occurrence happened between 56° C. and 58.5° C. in the second trial. In the second trial, the slope of the reference voltage is approximately −0.585 mV/° C. between 0° C. and 50° C., which is an improvement over the measured temperature dependence of the Schottky-diode-connected GaN HEMT.

Figure 7A:
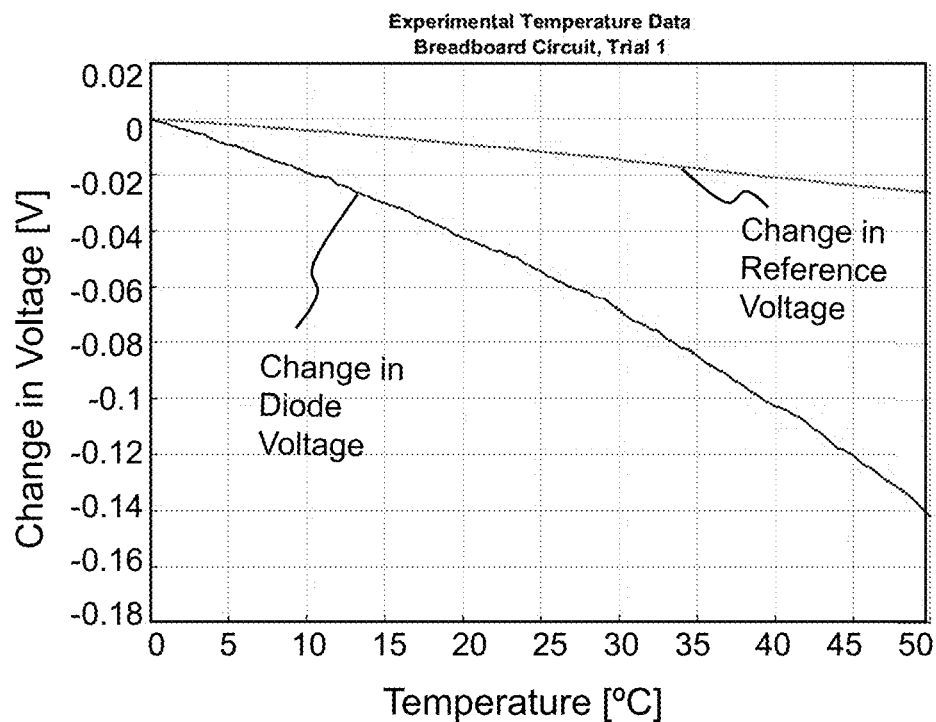
FIGS. 7A through 7C provide plots of temperature (° C.) versus change in voltage (V) for three trials of a breadboard version of the circuit board of FIG. 2D under environmental chamber temperature testing, comparing the change in first diode voltage and the change in the second (reference) diode voltage, in accordance with an exemplary embodiment of the present disclosure.
Figure 7B:
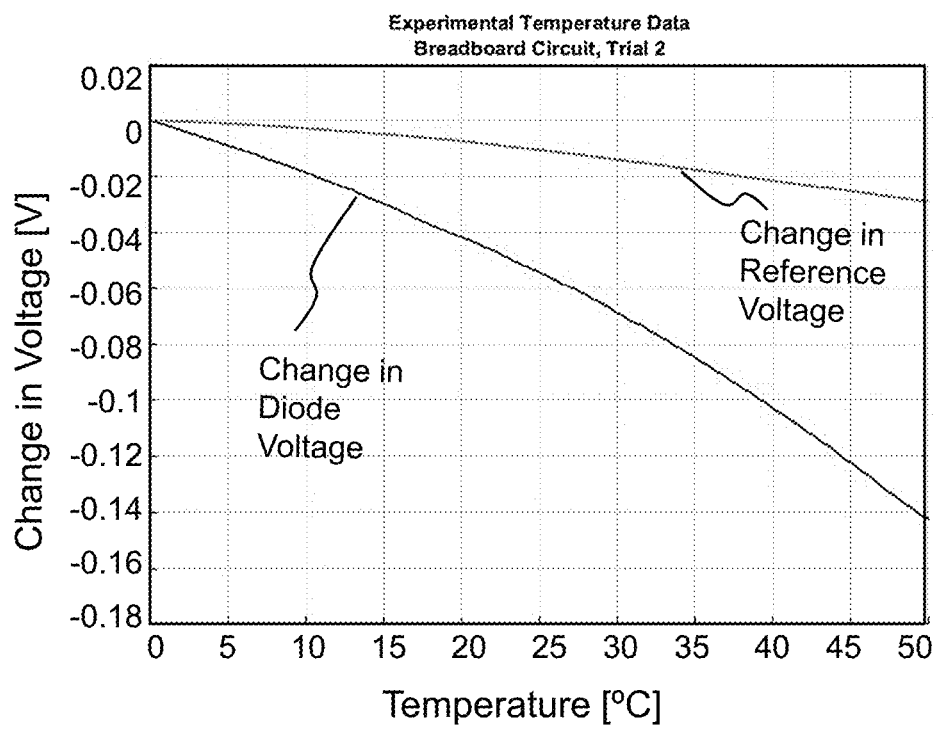
Figure 7C:
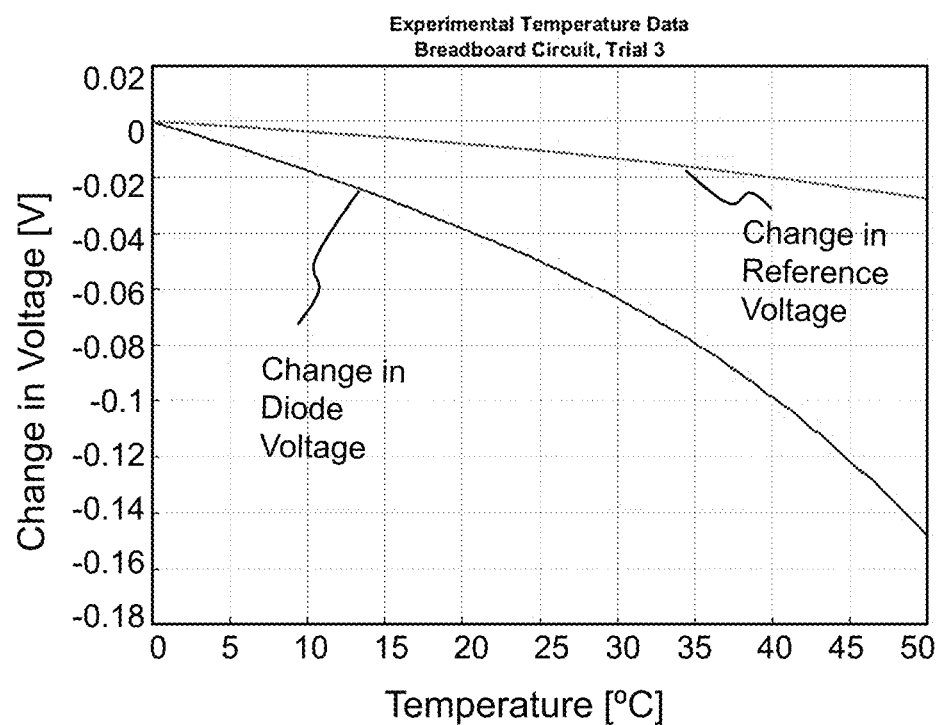
Figure 7D:
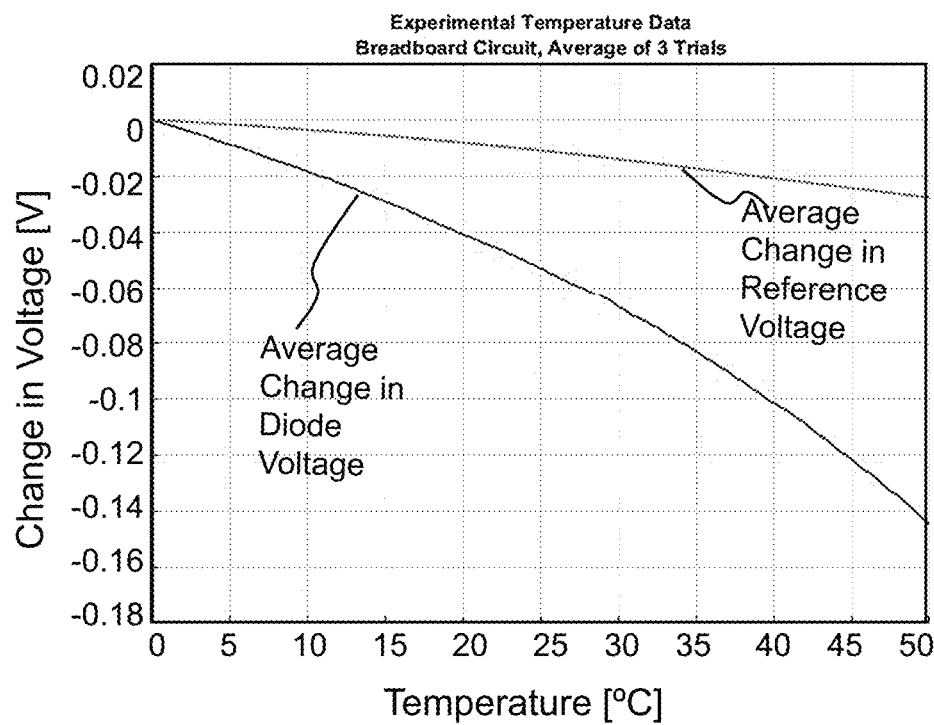
FIG. 7D provides a plot of temperature (° C.) versus change in voltage (V) of the average of FIGS. 7A through 7C, in accordance with an exemplary embodiment of the present disclosure.

Using a breadboard version of the circuit inside an environmental chamber, three trials were gathered in this experiment with a breadboard version of the circuit in the environmental chamber. In FIGS. 7A-7C, the change in diode voltage and the change in reference voltage are shown on the same plot. In FIG. 7D, the average of the change in diode voltage and the average of the change in reference voltage across all three trials is shown.

The temperature dependence can be approximated by using MATLAB's built-in fitting function polyfit to fit a line (n=1) to the average change in diode voltage as a function of temperature and the average change in reference voltage as a function of temperature. Doing this calculation yields a slope of −2.8 mV/° C. for the diode voltage, and an improved slope of −0.566 mV/° C. for the reference voltage for the averaged data.

Experiment 5

Circuit Irradiation

A prototype circuit board was assembled and tested under both alpha and neutron irradiation conditions. The circuit design from FIG. 2D was used to ensure physical separation of the GaN device being irradiated from the rest of the circuit, to develop a library of the circuit's response in known conditions, and to reduce the likelihood of observing signals resulting from particles interacting with a different area of the prototype detector. Using a PCB design approach for testing a prototype provided flexibility to change components and refine resistor values if needed based on experimental observations and results. Finally, fabricating a circuit as an integrated circuit is a process that takes time and money, whereas using discrete components on a circuit board is less expensive and has a faster turnaround time to obtain a functioning board.

To assemble the prototype, there were two primary types of materials needed. The first category is the discrete components for the different elements of the circuit. The other element of this prototype is the printed prototype circuit board itself. Cree Wolfspeed devices, model CGH40010F, an RF Power GaN high electron mobility transistor (HEMT) was used for the GaN Schottky diodes. The CGH40010F GaN devices made by growing GaN on SiC have a small (approximately 20 mm$^2$) footprint. The CGH40010F GaN transistors have a low turn-on voltage, reducing the input voltage demand required for operation. While these devices are not inherently Schottky diodes, when the source and drain are shorted together, the diode-connected GaN HEMT functions as a Schottky diode.

A current mirror needs transistors that are as close to identical as possible to ensure the current is mirrored accurately. In industry, "identical" transistors are accomplished with matched transistors, which are transistors that were manufactured on the same chip, and therefore have a high likelihood of having the same electronic characteristics within manufacturer tolerance. The bipolar junction transistors (BJTs) and metal-oxide-semiconductor field-effect transistors (MOSFETs) were considered for the transistors forming the current mirror. MOSFETs were chosen because they are industry-standard and have more ideal characteristics. Additionally, the gate current on MOSFETs is smaller than the base current of BJTs, resulting in fewer losses, which is an important consideration for current mirrors.

For the transistors that are labeled with "M" followed by a number in the schematic of FIG. 2D, two types of Advanced Linear Devices (ALD) quad-matched field-effect transistor arrays were used: ALD1106 (NMOS) and ALD1107 (PMOS). For both of these COTS components, there are four matched transistors that were fabricated on the same wafer, then diced and packaged together. For the device described herein, two of each type of MOSFET array were used. In the schematic, M1 and M2 needed to be matched p-type transistors and are two of the transistors on one of the ALD1107 arrays. Similarly, M3 and M4 needed to be matched n-type transistors and are two of the transistors on one of the ALD1106 arrays. The transistors labeled M5, M8 and M11 form the current mirror and carry the requirement of being matched p-type transistors; all three transistors for the current mirror are on the second ALD1107 array. Transistor M12 also needed to be p-type and is the fourth transistor on the second ALD1107 array; while it didn't necessarily need to be matched to the other transistors, using the last transistor on this chip enabled efficient use of space and components on the prototype. The transistors labeled M6, M7, M9 and M10 are all n-type transistors; while they didn't need to be matched, using a second ALD1106 MOSFET array was efficient and allowed use of the same manufacturer for all of the transistors on the board. Additionally, by utilizing ALD devices for all of these components, it is known that their electronic characteristics are all similar, which leads to more consistent performance across the components.

In the CMOS Bandgap Reference circuit, the value of the capacitor $C_1$ was 100 nF, chosen to balance optimal charging time with stabilization of the output. In circuit simulation testing, changing the value of this capacitor did not significantly change the simulation result, so it was left as 100 nF. The capacitor component for the PCB was obtained from the Van Leer electronics labs. One important note about the capacitor in the circuit: functionally, it serves to stabilize the output $V_{ref}$. As a result, this capacitor may have suppressed and/or delayed any transient signals observed.

Based on simulation performance, the resistor values for the first prototype were chosen as shown in Table 1. The value of R1 and R2 were chosen to be 24 kΩ. The only limitation on these resistors is that their values need to be the same for this circuit to function as a bandgap reference circuit. The value for resistor R3 was chosen through a combination of calculation and tuning. An initial value was chosen to be 1 kΩ. In simulations, this value was adjusted such that the slope of the PTAT and CTAT were equal but opposite signs, resulting in a final value of 700 Ω. The value of resistor R4 started at 50 kΩ, matching the CMOS bandgap reference circuit, but was adjusted to be 100 kΩ to yield greater stability in the circuit output across temperature. Transistor M7 is used as a voltage-controlled resistor and resistor R5 was added whose value was chosen experimentally during the simulation process.

TABLE 1

Resistor Values for Circuit of FIG. 2D.

| Resistor | Resistor value |
|---|---|
| $R_1$ | 24 kΩ |
| $R_2$ | 24 kΩ |
| $R_3$ | 700 Ω |
| $R_4$ | 100 kΩ |
| $R_5$ | 1 MΩ |

In addition to these components, low-noise, high-speed silicon germanium (SiGe) operational amplifiers, component LMH6629MFE/NOPB manufactured by Texas Instruments were ordered. One operational amplifier was included on the board that could be connected to amplify the output, if necessary. While the operational amplifier is unable to discriminate between noise and signal, it was included in the event that variations in the output voltage were too small to observe. Its position on the prototype is shown in a modified circuit in FIG. 2F, with resister values R6=18 kΩ and R7=2 kΩ producing a gain of 10 for the operational amplifier. However, this component was not utilized during testing due to a lack of access to a triple output power supply needed to bias the operational amplifier. Additionally, fluctuations in the output voltage were sufficiently large enough to be observed without the operational amplifier.

Example 6

Alpha Particle Source

For the first detector (circuit shown in FIG. 2D), the alpha source used was a foil americium-241 (Am-241) source with a measured activity of $4.56 \times 10^{-2}$ µCi. Converting this activity from µCi to decays per second gives the activity of the Am-241 source to be $1.6872 \times 10^3$ alphas/second.

The exposed area of the packaged GaN HEMT, as measured with a pair of digital Vernier calipers, is 5.1 mm by 4.0 mm, with an irradiated area of 20.4 mm². For this experiment, the detector device was radiated at a distance of approximately 1 centimeter. Thus, the solid angle irradiated is $4\pi d^2 = 1.2566 \times 10$ mm². The fraction of alpha particles emitted by the Am-241 source that might be "seen" by the detector device is 0.0162. Assuming every possible alpha particle interacts with the device, the device is expected to see 27.4 alphas/second, or one alpha particle every 36.5 ms.

This calculation assumes 100% interaction probability and high detector efficiency; thus, it provides the best-case value. Calculate interaction probability using Equation 11:

$$P_{int} = \frac{\overline{N}_{int}}{\overline{N}}, \quad \text{(Eq. 11)}$$

where $\overline{N}^-_{int}$ is the average number of particles that have an interaction, and $\overline{N}^-$ is the average number of incident particles. The average number of particles that have an interaction is given by Equation 12:

$$\overline{N}_{int} = \Omega A n_{tar/cc} \sigma dx \quad \text{(Eq. 12)}$$

where Ω is the neutron flux, A is the area of the particle beam, $n_{tar/cc}$ is the target density in atoms/cm³, σ is the cross-section, and dx is the thickness of the target. For 5.486

MeV alpha particles and this prototype, this calculation yields interaction probabilities on the order of 0.15. However, this calculation does not account for the plastic packaging of the Cree GaN devices, given that alpha particles have an approximate stopping range of 50 μm in plastic. While information about the thickness of the packaging of the Cree devices in not available, it is probable that the packaging is thick enough that most, if not all, of the alpha particles may be stopped prior to reaching the device.

For the second detector (circuit shown in FIG. 2F), the alpha source used an unsealed foil americium-241 (Am-241) source with a measured activity of 0.103 mCi. Converting this activity from mCi to decays per second gives the activity of the Am-241 source to be $3.811\times10^6$ alphas/second.

As in the previous experiment discussed above, the exposed area of the packaged GaN HEMT, as measured with a pair of digital Vernier calipers, is 5.1 mm by 4.0 mm, with an irradiated area of 20.4 mm$^2$. For this experiment, the detector device was radiated at a distance of approximately 1 centimeter. Thus, the solid angle irradiated is $4\pi d2=1.2566\times103$ mm$^2$. The fraction of alpha particles emitted by the Am-241 source that might be "seen" by the detector device is 0.0162. Assuming every possible alpha particle interacts with the device, it was expected to see $6.18\times104$ alphas/second, or one alpha particle every 16.16 μs.

Example 7

Equipment for Alpha Particle Irradiation

For the first detector (circuit shown in FIG. 2D), in addition to the first prototype circuit board, a transistor adapter board and jumper wires were utilized during this experiment. The circuit was powered to +5 V using a Protek 3003B DC power supply, connected to the positive (red) and ground (black) leads on the prototype by banana cables. Prior to turning on the power supply in connection to the prototype board, the power supply output voltage was confirmed to be 5.034 V via a Fluke multimeter to prevent accidentally exceeding the power or current compliance of any of the circuit components. During the experiment, the multimeter was also connected to the prototype board to monitor the power supply voltage being delivered to the circuit.

The oscilloscope used was a LeCroy WaveRunner 620Zi with a bandwidth of 2 GHz and a maximum sampling rate of 20 Gs/s. The oscilloscope was connected to measurement output and ground on the prototype board using BNC cables and BNC-to-banana converters. Channel 1 was connected to the third output measurement (the third yellow banana socket on the prototype) to measure the voltage drop across the irradiated diode-connected GaN HEMT. Channel 2 was connected to the middle output measurement (the second yellow banana socket on the prototype) to measure the reference voltage. Each channel was zeroed on the oscilloscope screen, with an offset of −1.1845 V for the first channel and an offset of −2.9075 V on the second channel. For both channels, the voltage gradation was set to 100 mV/div, and the common time axis was set to a gradation of 100 ns/div. The maximum memory was increased to its highest possible value, 2.5 MS (Mega-samples, or 1 million data points).

An important facet of setting up an oscilloscope are determining the trigger conditions. The trigger type was set to Edge and used the Find Level feature for both channels to provide a starting point. For channel 1, trigger level was set to 1.186 V, and the trigger level on channel 2 was set to 2.901 V. The Trigger mode was set to auto, so it would automatically begin recording data when the trigger condition was met. The slope condition was changed from "slope increasing" to "either" (slope increasing or decreasing).

For the second detector (circuit shown in FIG. 2F), in addition to the second prototype circuit board, three transistor adapter boards and jumper wires were used during the experiments. A Hewlett-Packard 6236B triple outlet power supply powered the circuit to +5 V, as confirmed by a Fluke multimeter. During the experiment, this multimeter remained connected to the power supply to verify the voltage did not fluctuate. After setting up the experiment, the power supply voltage was maintained without irradiation or setup modification for 2 hours to ensure that the prototype output reached steady state.

The oscilloscope utilized in this experiment was a Keysight InfiniiVision DSOX4024A with a bandwidth of 200 MHz and a maximum sampling rate of 5 Gs/s. As in the experiments with the first detector, the oscilloscope was connected to measurement output and ground, using BNC cables and BNC-to-banana converters to connect to the prototype. Channel 1 was connected to the reference voltage output (the second yellow banana socket on this prototype). Channel 2 was connected to the other yellow banana socket on this prototype to measure the voltage drop across the irradiated diode-connected GaN HEMT. Each channel was positioned on the oscilloscope screen such that the traces from both channels were observed on the screen. Rather than being zeroed, this technique meant that each signal was offset by one major tick mark from zero on the oscilloscope screen. The voltage offsets required to achieve this setup were −4.637 V for the first channel measuring the reference voltage and −1.39750 V for the second channel measuring the voltage across the GaN diode-connected HEMT. For both channels, the voltage gradation was set to 10 mV/div and the common time axis was set to a gradation of 100 ns/div.

In these experiments, the trigger settings were established utilizing information from the experiments with the first detector. Triggering was dependent on the second channel, which measured the diode voltage. The trigger mode was set to Edge and the slope condition was changed to "either" (slope increasing or decreasing) as both types were observed in the Sandia experiments. After some experimenting during the setup, the initial value of the trigger was chosen to be 1.3735 V compared to the diode voltage offset of 1.3975 V (−0.024 V relative to the diode voltage offset). After an initial five minute period of irradiation, the trigger voltage was increased to 1.3865 V (−0.011 V relative to the diode voltage offset).

Throughout the experiment, a Fluke 451P-RYR x-ray and gamma detector was positioned near the prototype board. The rate read by the meter during irradiation did not exceed the background readings which fluctuated between 20-30 μR/hr.

Example 8

Temporal Transient Analysis with Alpha Particle Source

Figure 8A:
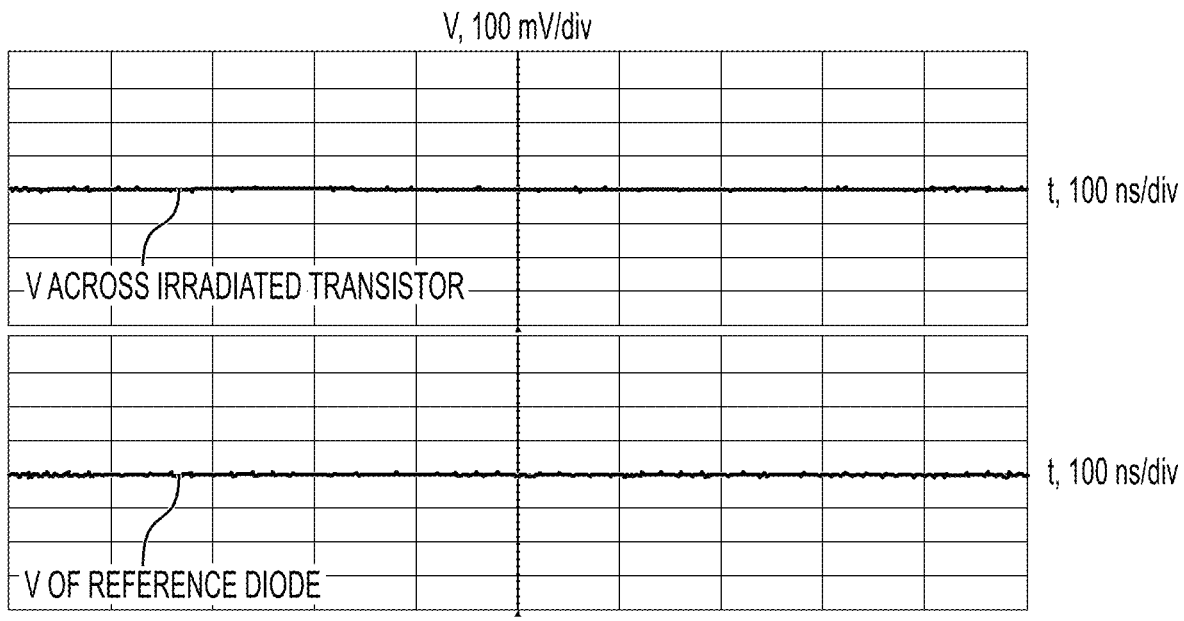
FIGS. 8A and 8B provide background signal (FIG. 8A) and transient signal (FIG. 8B) during alpha particle irradiation of an example detector having the circuit board of FIG. 2D, in accordance with an exemplary embodiment of the present disclosure.
Figure 8B:
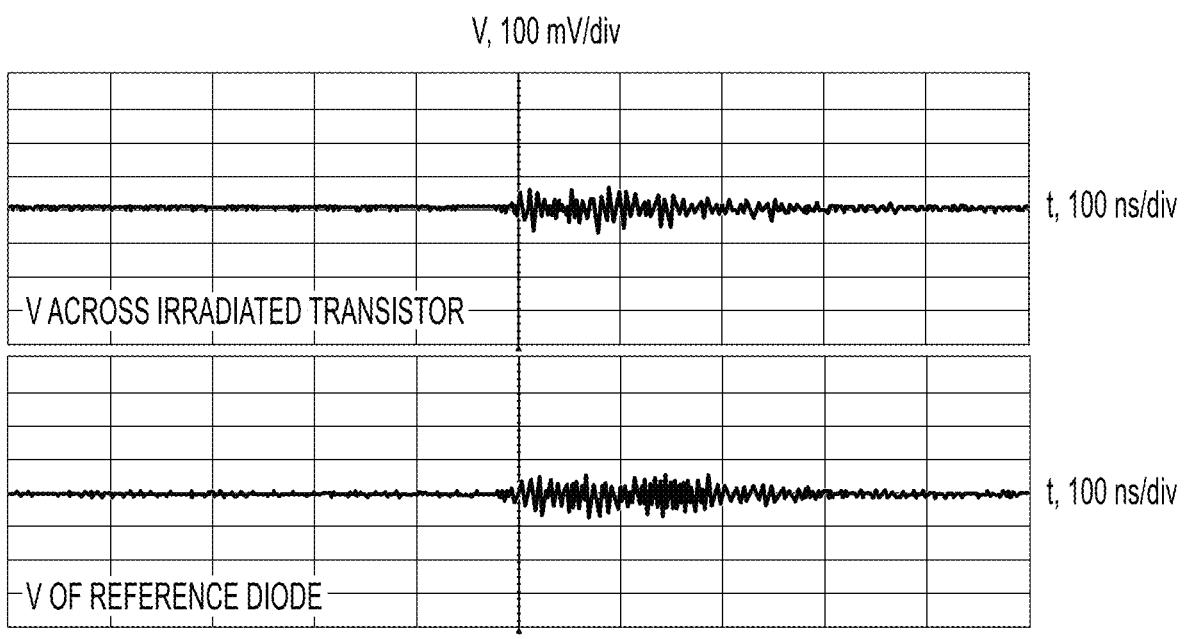
Figure 9A:
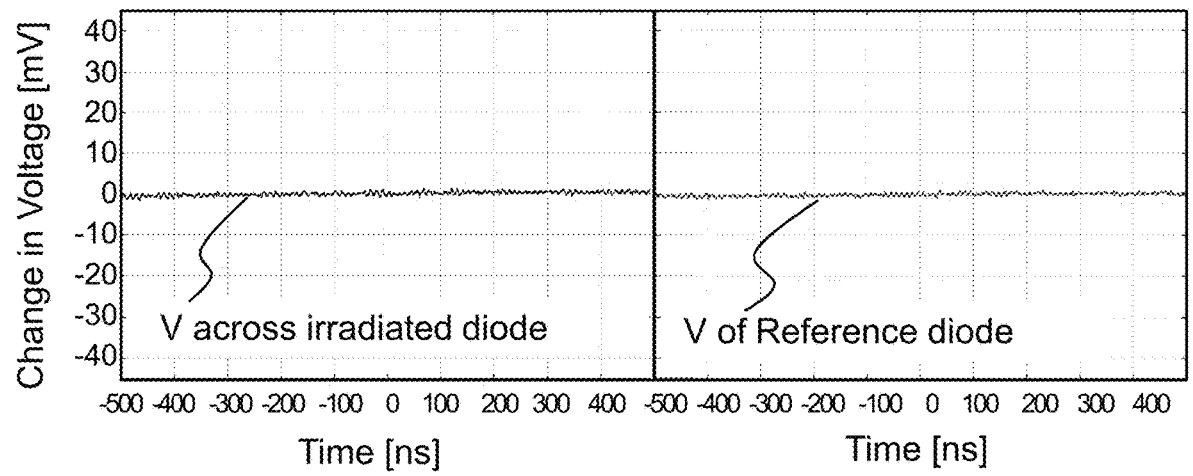
FIGS. 9A and 9B provide background signal (FIG. 9A) and transient signal (FIG. 9B) during neutron irradiation of an example detector having the circuit board of FIG. 2F, in accordance with an exemplary embodiment of the present disclosure.
Figure 9B:
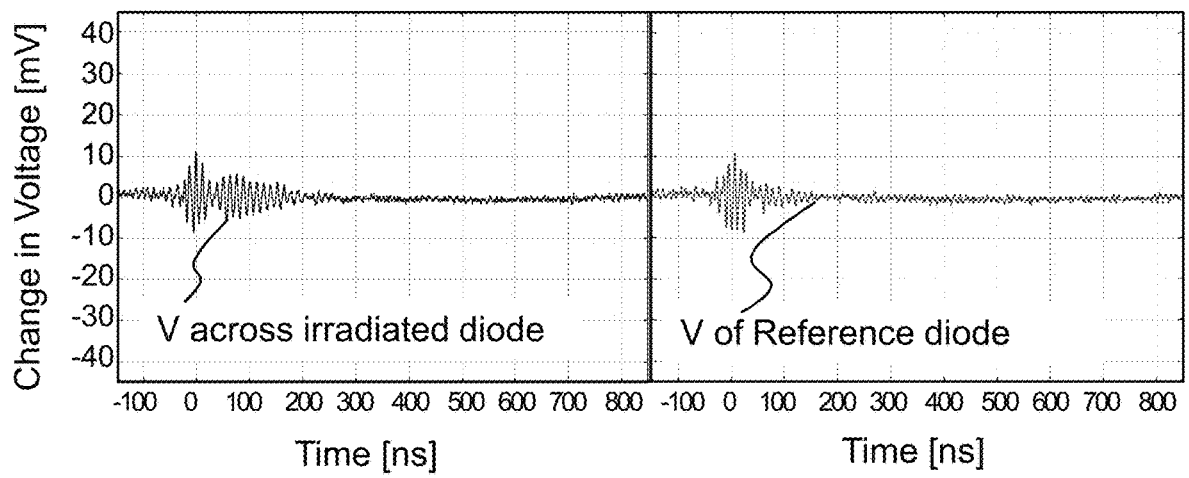

The oscilloscope output during alpha irradiation detected by a first example detector (circuit shown in FIG. 2D) is provided in FIGS. 8A and 8B, and by a second example detector (circuit shown in FIG. 2F) in FIGS. 9A and 9B. From these experiments and analyses, observation of transient signals under alpha irradiation was demonstrated with the detectors described herein. Spectral analysis indicates that there are higher-frequency components in the signal between 100 and 200 MHz that are not present in background signals collected without a radiation source present. Additionally, calculating normalized cross-correlation coefficients show low values (less than 0.1) of the diode voltage when compared to background signals, and larger values (0.2-0.35) when compared to the diode voltage of other transient signals. The largest cross-correlation coefficient observed occurs when comparing the diode voltage with the reference voltage of any given transient signal, providing evidence that the diode voltage changes are also observed at the reference voltage output. The other normalized cross-correlation calculations demonstrate similarities in different diode voltage signals observed that occur near the trigger, while the decreasing overlap at larger lag values indicates that the transient signals display different properties as the signal decays.

Example 9

Neutron Source

For the first detector (circuit shown in FIG. 2D), the neutron source used in this experiment is a sealed americium-lithium (AmLi) source with a measured activity of $8.18 \times 10^4$ µCi. Converting this activity from µCi to decays per second gives the activity of the AmLi source to be $4.9736 \times 10^7$ neutrons/second.

The exposed area of the packaged GaN HEMT, as measured with a pair of digital Vernier calipers and verified with comparison to the part datasheet, is 5.1 mm by 4.0 mm, with an irradiated area of 20.4 mm². For this experiment, the detector device was radiated at a distance of approximately 1 centimeter. Thus the solid angle irradiated is $4\pi d^2 = 1.2566 \times 10^3$ mm². The fraction of neutrons emitted by the AmLi source that might be "seen" by the detector device is 0.0162. Assuming every possible neutron interacts with the device, $4.91 \times 10^7$ neutrons/second would be expected, or one neutron every 20.4 ns.

As with the alpha source, this calculation assumes 100% interaction probability and high detector efficiency; thus, it provides the best-case value. Calculating the interaction probability using Equations 11 and 12 and using available data tables for the neutron cross-section values yields an interaction probability less than 0.03% across the possible neutron energies emitted by the AmLi source.

For the second detector (circuit shown in FIG. 2F), a Cf-252 neutron source with a source yield of $9.2 \times 10^3$ neutrons/second was utilized.

As in the previous experiment discussed above, the exposed area of the packaged GaN HEMT, as measured with a pair of digital Vernier calipers, is 5.1 mm by 4.0 mm, with an irradiated area of 20.4 mm². For this experiment, the detector device was radiated at a distance of approximately 1 centimeter. Thus, the solid angle irradiated is $4\pi d^2 = 1.2566 \times 10^3$ mm². The fraction of neutrons emitted by the Cf-252 source that might be "seen" by the detector device is 0.0162. Assuming every possible neutron interacts with the device, $1.49 \times 10^2$ neutrons/second would be expected, or one alpha particle every 6.7 ms.

As with the alpha source, this calculation is a best-case value which assumes 100% interaction probability and high detector efficiency. Calculating the interaction probability using Equations 11 and 12 and using available data tables for the neutron cross-section values, this calculation yields an interaction probability less than 0.05% across the possible neutron energies emitted by the Cf-252 source.

Example 10

Equipment for Neutron Irradiation

Similar to the alpha irradiation experiment for the first detector (circuit shown in FIG. 2D) described above, the first prototype circuit board, the transistor adapter board, and jumper wires, were utilized during this experiment. The circuit was powered to +5 V using a Protek 3003B DC power supply, connected to the positive (red) and ground (black) leads on the prototype by banana cables. Prior to turning on the power supply in connection to the prototype board, power supply output voltage was confirmed to be 5.008 V via a Fluke multimeter to prevent accidentally providing more than the intended 5V voltage supply which might exceed the power or current compliance of any of the circuit components. During the experiment, the multimeter was also connected to the prototype board to monitor the power supply voltage being delivered to the circuit.

The oscilloscope used was a LeCroy WaveRunner 620Zi with a bandwidth of 2 GHz and a maximum sampling rate of 20 Gs/s. The oscilloscope was connected to measurement output and ground on the prototype board using BNC cables and BNC-to-banana converters. Channel 1 was connected to the third output measurement (the third yellow banana socket on the prototype) to measure the voltage drop across the irradiated diode-connected GaN HEMT. Channel 2 was connected to the middle output measurement (the second yellow banana socket on the prototype) to measure the reference voltage. Each channel was zeroed on the oscilloscope screen, with an offset of −1.1865 V for the first channel and an offset of −3.1360 V on the second channel. For both channels, the voltage gradation was set to 100 mV/div, and the common time axis was set to a gradation of 100 ns/div. The maximum memory was increased to its highest possible value, 2.5 MS (Mega-samples, or 1 million data points).

An important facet of setting up an oscilloscope are determining the trigger conditions. The trigger type was set to Edge and the Find Level feature was used for both channels to provide a starting point. For channel 1, trigger level was set to 1.205 V. The exact value of the trigger level on channel 2 was not recorded, but most likely was approximately 0.02 V above the voltage offset. As with the alpha experiment, the Trigger mode was set to auto, so it would automatically begin recording data when the trigger condition was met and set the slope condition from "slope increasing" to "either" (slope increasing or decreasing).

For the second detector (circuit shown in FIG. 2F), in addition to the second prototype circuit board, three transistor adapter boards and jumper wires were used during the experiments. A Hewlett-Packard 6236B triple outlet power supply powered the circuit to +5 V, as confirmed by a Fluke multimeter. During the experiment, this multimeter remained connected to the power supply to verify the voltage did not fluctuate. After setting up the experiment, the power supply voltage was maintained without irradiation or setup modification for 2 hours to ensure that the prototype output reached steady state.

The same Keysight InfiniiVision DSOX4024A oscilloscope with a bandwidth of 200 MHz and a maximum sampling rate of 5 Gs/s was used. Channel 1 measured the reference voltage at the circuit output and Channel 2 measured the diode voltage across the irradiated GaN device.

Each channel was positioned on the oscilloscope screen such that the traces from both channels were observed on the screen. Rather than being zeroed, this technique meant that each signal was offset by one major tick mark from zero on the oscilloscope screen. The voltage offsets required to achieve this setup were −4.6611 V for the first channel measuring the reference voltage and −1.39761 V for the second channel measuring the voltage across the GaN diode-connected HEMT. For both channels, the voltage gradation was set to 1 mV/div and the common time axis was set to a gradation of 20 is/div.

Throughout the experiment, a Fluke 451P-RYR x-ray and gamma detector was placed near the prototype board. The rate read by the meter during irradiation was recorded to be 42 µR/hr, a value slightly elevated above the background readings which fluctuated between 20-30 µR/hr. Additionally, a Neutron Survey Meter, Model REM 500, Serial #359 was placed near the experiment. This meter read between 0.2-0.3 mrem/hr during the irradiation experiment and 0 mrem/hr when the Cf-252 source was not present.

Example 11

Temporal Transient Analysis with Neutron Source

Figure 10A:
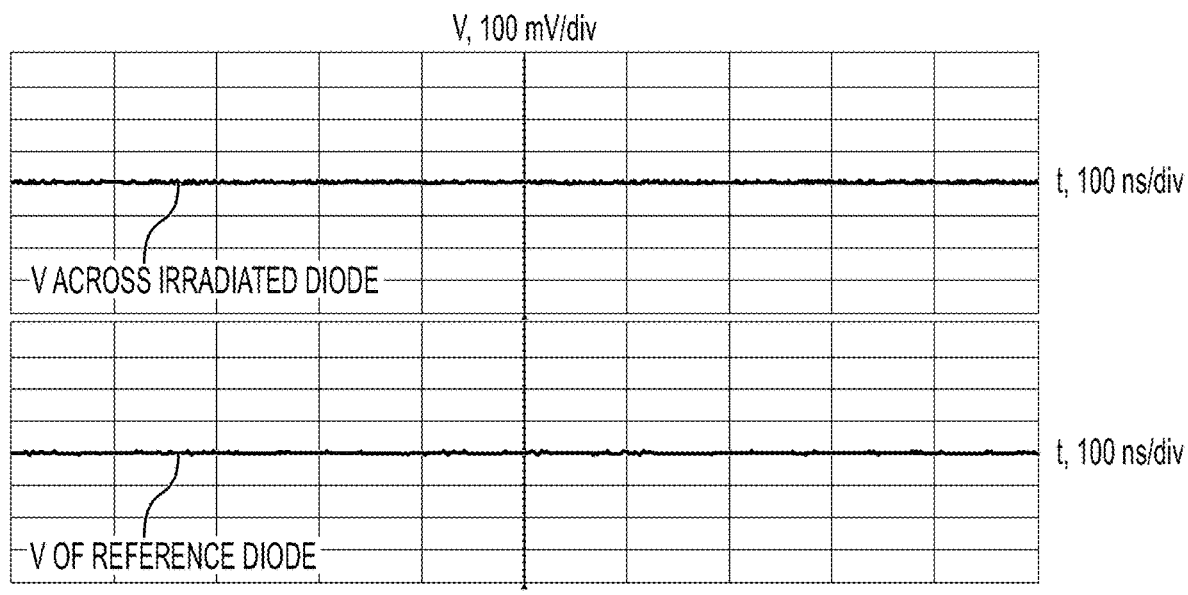
FIGS. 10A and 10B provide background signal (FIG. 10A) and transient signal (FIG. 10B) during alpha particle irradiation of an example detector having the circuit board of FIG. 2D, in accordance with an exemplary embodiment of the present disclosure.
Figure 10B:
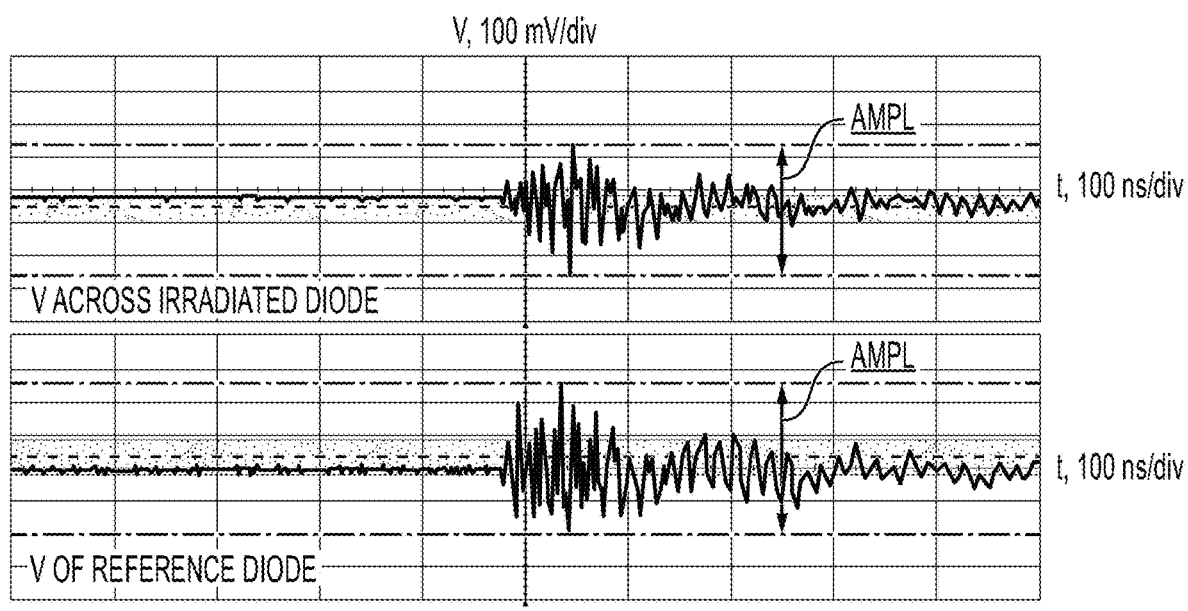
Figure 11A:
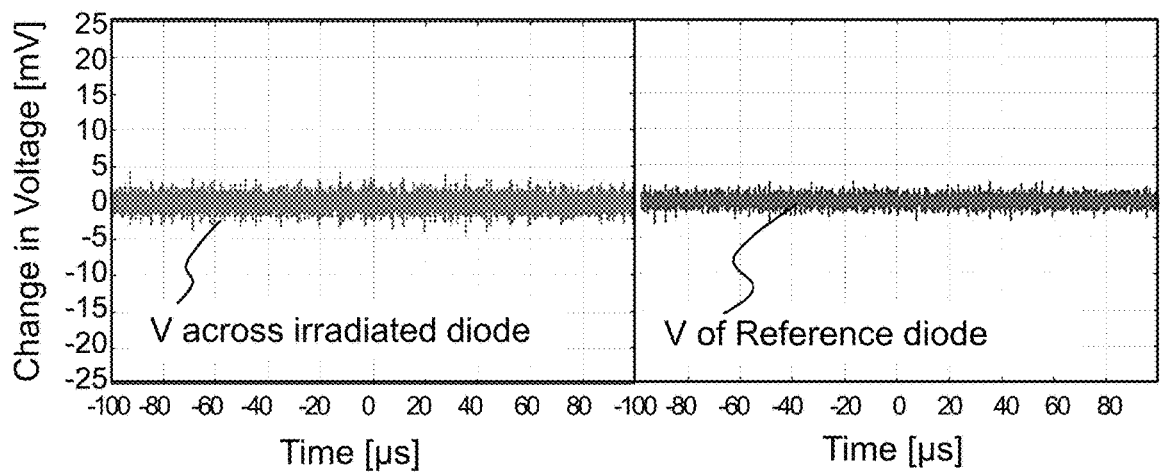
FIGS. 11A and 11B provide background signal (FIG. 11A) and transient signal (FIG. 11B) during neutron irradiation of an example detector having the circuit board of FIG. 2F, in accordance with an exemplary embodiment of the present disclosure.
Figure 11B:
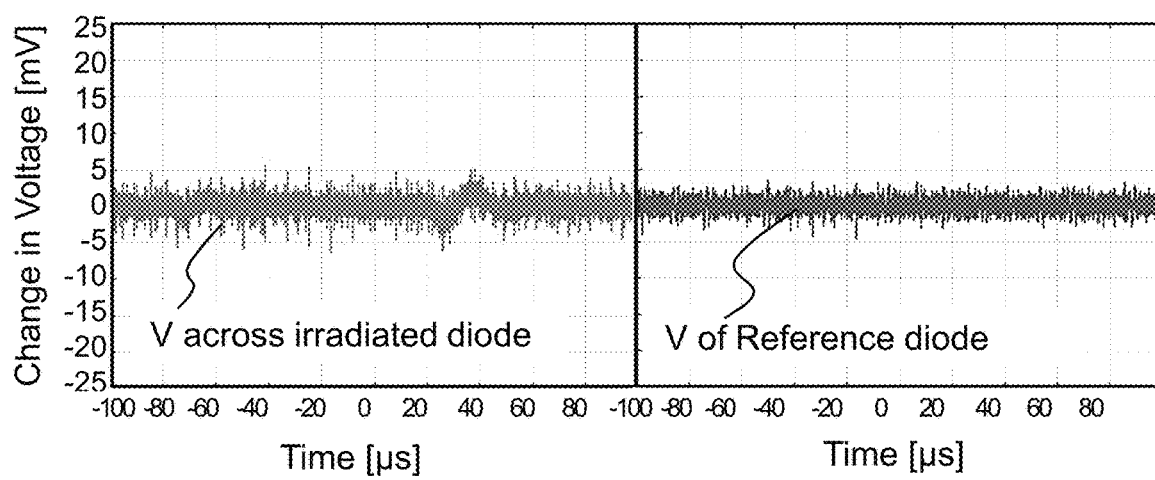

The oscilloscope output during neutron irradiation of a first example device (circuit shown in FIG. 2D) is provided in FIGS. 10A and 10B, and of a second example device (circuit shown in FIG. 2F) in FIGS. 11A and 11B. From this experiment and analysis, observation of transient signals under neutron irradiation was demonstrated with an example detector of the work function reference circuit. The decay in the transient signals lasts for several hundred nanoseconds; in most cases, the decay continued past the temporal range of the oscilloscope screen. Additionally, the length of the decay time compared to predicted rate of neutrons entering the GaN device based on source activity indicates there is potential that these signals contain events triggered by multiple neutrons.

One general trend when comparing the alpha and neutron data, particularly the neutron data from the second period of irradiation, is that the alpha amplitudes observed are smaller, suggesting that less energy is transferred from alpha particles than from neutrons. One interesting note is that the alpha transient signals for which both diode voltage and reference voltage data were captured display a trend that the amplitude of the reference voltage is smaller than the amplitude of the diode voltage. Qualitatively comparing the alpha and neutron transient signals observed gathered during experiments described above suggests key signal features like the amplitude and decay time of the transient signals from alpha irradiation differ from those observed under neutron irradiation.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. A detector comprising:
   a sensor comprising a first diode comprising a first piezoelectric lattice abutting a first metal and forming a first junction, wherein the sensor is configured to be exposed to subatomic particles; and
   a voltage reference member comprising two or more second diodes, each second diode comprising a second piezoelectric lattice, wherein the voltage reference member is configured to generate a reference measurement;
   wherein the sensor and the voltage reference member are in electrical communication.

2. The detector of claim 1, wherein the second piezoelectric lattice of each of the second diodes abuts a second metal and forms a second junction; and
   wherein the two or more diodes are connected in a parallel circuit.

3. A detector comprising:
   a sensor comprising a first diode comprising first semiconductor material abutting a first metal and forming a first junction, wherein the sensor is configured to be exposed to subatomic particles; and
   a voltage reference member configured to generate a reference measurement;
   wherein the sensor and the voltage reference member are in electrical communication and form a bandgap reference circuit having an energy output substantially proportional to an energy level barrier height of the first junction of the sensor;
   wherein the barrier height of the first junction satisfies the following equation:

$$\Phi_B(t) = \phi_m(t) - X_e(t);\text{ and}$$

wherein:
   $\Phi_B$ is the barrier height of the first junction;
   $\phi_m$ is a metal work function of the first metal;
   $X_e$ is an electron affinity of the first semiconducting material; and
   t is a time of a subatomic particle passing through the detector.

4. The detector of claim 3, wherein a change in the barrier height of the first junction corresponds to a voltage output of the detector.

5. The detector of claim 4, wherein the voltage output of the detector is substantially proportional to a work function of the detector.

6. The detector of claim 5, wherein a change in the voltage output of the detector is associated with a signal signature for the subatomic particles.

7. The detector of claim 3, wherein the voltage reference member comprises two or more second diodes, each of the second diodes comprising a second semiconducting material abutting a second metal and forming a second junction;
wherein the two or more diodes are connected in a parallel circuit; and
wherein the first semiconductor material comprises a first piezoelectric lattice and the second semiconductor materials comprises a second piezoelectric lattice.

8. The detector of claim 3, wherein the voltage reference member comprises two or more second diodes, each of the second diodes comprising a second semiconducting material abutting a second metal and forming a second junction;
wherein the two or more diodes are connected in a parallel circuit; and
wherein the first and second semiconductor materials independently comprise GaN, GaAs, SiC, AlGaN, AlGaAs, AlInAs, GaInAs, InGaN, ScAlN, CuInP2S6, Pb(Zr0.4Ti0.6)O3 and combinations thereof.

9. A detector comprising:
a sensor configured to be exposed to at least a first subatomic particle and a second subatomic particle; and
a voltage reference member in electrical communication with the sensor and configured to generate a reference measurement;
wherein the detector is configured to output a first signal associated with the first subatomic particle and a second signal associated with the second subatomic particle; and
wherein the first subatomic particle is different than the second subatomic particle.

10. A detector comprising:
a sensor configured to be exposed to subatomic particles;
a voltage reference member in electrical communication with the sensor and configured to generate a reference measurement; and
one or more transistors in electrical communication with the sensor and the voltage reference member;
wherein the one or more transistors comprise one or more of a junction-gate field-effect transistor (JFET), a heterojunction bipolar transistor (HBT), a high electron mobility transistor (HEMT), a metal-semiconductor field-effect transistor (MESFET), a metal-oxide-semiconductor field-effect transistor (MOSFET), and a complementary metal-oxide-semiconductor (CMOS).

11. A method comprising:
exposing a sensor to one or more subatomic particles; and
outputting a change in a work function in the sensor with respect to a voltage reference member in electrical communication with the sensor as a signal associated with interactions with one or more of the subatomic particles;
wherein the sensor comprises a first diode comprising a first semiconducting material abutting a first metal and forming a first junction;
wherein the voltage reference member comprises two or more second diodes, each second diode comprising a second semiconducting material abutting a second metal and forming a second junction; and
wherein the voltage reference member is configured to generate a reference measurement.

12. The method of claim 11, wherein the first semiconductor comprises a first piezoelectric lattice and the second semiconductor materials comprises a second piezoelectric lattice.

13. The method of claim 11 further comprising:
forming a bandgap reference circuit between the sensor and the voltage reference member.

14. The method of claim 11 further comprising:
measuring the change in work function; and
forming a bandgap reference circuit between the sensor and the voltage reference member;
wherein measuring the change in work function in the sensor with respect to the reference measurement of the voltage reference member comprises determining an energy level barrier height of the first junction of the sensor from the bandgap reference circuit;
wherein the barrier height of the first junction satisfies the following equation:

$$\Phi_B(t) = \phi_m(t) - X_e(t);$$ and wherein:
$\Phi_B$ is the barrier height of the first junction;
$\phi_m$ is a metal work function of the first metal;
$X_e$ is an electron affinity of the first semiconducting material; and
t is a time of a subatomic particle passing through a detector comprising the sensor and the voltage reference member.

15. The method of claim 11 further comprising:
correlating the signal associated with interactions with one or more of the subatomic particles to a reference library, the reference library comprising signals of one or more properties selected from the group consisting of a subatomic particle type, a subatomic particle energy, a subatomic particle direction, and a subatomic particle location relative to a detector comprising the sensor and the voltage reference member.

16. The method of claim 11, wherein the signal associated with interactions with one or more of the subatomic particles comprises a signal feature selected from the group consisting of a signal shape, a decay time, a frequency spectra, and a combination thereof.

17. A method comprising:
exposing a first Schottky diode to one or more subatomic particles; and
generating an output based on a difference in voltage of the first Schottky diode with a reference measurement of a reference voltage member;
wherein the first Schottky diode is in electrical communication with the reference voltage member;
wherein the reference voltage member comprises a parallel circuit of two or more second Schottky diodes;
wherein the reference voltage member is configured to generate the reference measurement; and
wherein the output is indicative of interactions with one or more of the subatomic particles.

18. The method of claim 17 further comprising:
detecting a change in voltage of the first Schottky diode; and
monitoring transient differences in voltage associated with one or more of the interactions.

19. The method of claim 18 further comprising:
detecting radiation.

20. The method of claim 17, wherein the output is approximately proportional to an energy level barrier height of the first Schottky diode.

* * * * *